US010615118B2

(12) United States Patent
Lee

(10) Patent No.: US 10,615,118 B2
(45) Date of Patent: *Apr. 7, 2020

(54) ANTI-FUSE DEVICE, MEMORY DEVICE INCLUDING THE SAME AND SEMICONDUCTOR DEVICE COMPRISING AN ANTI-FUSE DEVICE

(71) Applicant: SAMSUNG ELECTRONICS CO., LTD., Suwon-si, Gyeonggi-do (KR)

(72) Inventor: Dong-hyun Lee, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/285,332

(22) Filed: Feb. 26, 2019

(65) Prior Publication Data

US 2019/0189559 A1 Jun. 20, 2019

Related U.S. Application Data

(63) Continuation of application No. 15/670,096, filed on Aug. 7, 2017, now Pat. No. 10,236,249.

(30) Foreign Application Priority Data

Dec. 9, 2016 (KR) ........................ 10-2016-0168006

(51) Int. Cl.
*H01L 23/525* (2006.01)
*G11C 17/16* (2006.01)
*H01L 27/112* (2006.01)
*G11C 17/18* (2006.01)
*H01L 27/10* (2006.01)
*H01L 29/423* (2006.01)

(52) U.S. Cl.
CPC .......... *H01L 23/5252* (2013.01); *G11C 17/16* (2013.01); *G11C 17/18* (2013.01); *H01L 23/525* (2013.01); *H01L 27/101* (2013.01); *H01L 27/11206* (2013.01); *H01L 29/423* (2013.01); *H01L 29/42368* (2013.01)

(58) Field of Classification Search
CPC ................ G11C 17/16; H01L 23/5252; H01L 27/11206
USPC ...................................................... 365/225.7
See application file for complete search history.

(56) References Cited

U.S. PATENT DOCUMENTS

| 6,570,207 B2 | 5/2003 | Hsu et al. |
| 7,368,348 B2 | 5/2008 | Lee |
| 7,528,065 B2 | 5/2009 | Clevenger et al. |
| 8,450,786 B2 | 5/2013 | Kim et al. |

(Continued)

FOREIGN PATENT DOCUMENTS

| JP | 2008-300623 A | 12/2008 |
| JP | 2012-038964 A | 2/2012 |

(Continued)

*Primary Examiner* — Son L Mai
(74) *Attorney, Agent, or Firm* — Lee IP Law, P.C.

(57) ABSTRACT

An anti-fuse device includes a program transistor and a read transistor. The program transistor executes a program via insulation breakdown of a gate insulating layer. The read transistor is adjacent to the program transistor and reads the state of the program transistor. At least one of a first gate electrode of the program transistor or a second gate electrode of the read transistor is buried in a substrate.

20 Claims, 34 Drawing Sheets

(56) References Cited

U.S. PATENT DOCUMENTS

| | | | |
|---|---|---|---|
| 8,699,290 B2 | 4/2014 | Kim | |
| 8,779,492 B2 | 7/2014 | Takaishi et al. | |
| 8,878,291 B2 * | 11/2014 | Jung | H01L 27/11206 |
| | | | 257/331 |
| 8,883,624 B1 | 11/2014 | Ramkumar | |
| 8,933,492 B2 | 1/2015 | Kurjanowicz | |
| 9,059,279 B2 | 6/2015 | Lee | |
| 9,263,383 B2 | 2/2016 | Kim | |
| 9,484,203 B2 | 11/2016 | Lim et al. | |
| 9,490,333 B2 * | 11/2016 | Park | H01L 29/4236 |
| 10,236,249 B2 * | 3/2019 | Lee | H01L 23/5252 |
| 2008/0296677 A1 | 12/2008 | Takaishi | |
| 2015/0206595 A1 | 7/2015 | Jeong | |

FOREIGN PATENT DOCUMENTS

| | | |
|---|---|---|
| KR | 10-2002-0046933 A | 6/2002 |
| KR | 10-2011-0014581 A | 2/2011 |
| KR | 10-2013-0044655 A | 5/2013 |
| KR | 10-2015-0060367 A | 6/2015 |
| KR | 10-2016-0064041 A | 6/2016 |

\* cited by examiner

ANTI-FUSE DEVICE, MEMORY DEVICE INCLUDING THE SAME AND SEMICONDUCTOR DEVICE COMPRISING AN ANTI-FUSE DEVICE

CROSS-REFERENCE TO RELATED APPLICATIONS

This is a continuation application based on pending application Ser. No. 15/670,096, filed Aug. 7, 2017, the entire contents of which is hereby incorporated by reference.

Korean Patent Application No. 10-2016-0168006, filed on Dec. 9, 2016, and entitled, "Anti-Fuse Device and Memory Device Including the Same," is incorporated by reference herein in its entirety.

BACKGROUND

1. Field

One or more embodiments described herein relate to an anti-fuse device and a memory device including an anti-fuse device.

2. Description of the Related Art

Efforts are being made to increase the operating speed and storage capacity of semiconductor devices. At the same time, a variety of techniques have been proposed to improve their integration, reliability, and response rate. During manufacturing, defects may occur in memory cells and/or other features of the semiconductor devices. These defects may adversely affect overall performance.

SUMMARY

In accordance with one or more embodiments, an anti-fuse device includes a program transistor to execute a program via insulation breakdown of a gate insulating layer; and a read transistor, adjacent to the program transistor, to read a state of the program transistor, wherein at least one of a first gate electrode of the program transistor or a second gate electrode of the read transistor is buried in a substrate.

In accordance with one or more other embodiments, a semiconductor device comprising an anti-fuse device includes a program transistor including a first gate structure and a first impurity region, the first gate structure including a buried gate electrode buried in a substrate, with a gate insulating layer between the buried gate electrode and the substrate, the first impurity region arranged on an upper portion of the substrate adjacent to the first gate structure, the program transistor to execute a program via insulation breakdown of the gate insulating layer; and a read transistor adjacent to the program transistor, the read transistor including a second gate structure, the first impurity region, and a second impurity region, the second gate structure includes a planar gate electrode on an upper surface of the substrate, with a gate insulating layer between the planar gate electrode and the upper surface of the substrate, the first impurity region is on a side surface of the second gate structure, the second impurity region on an upper portion of the substrate, on another side surface of the second gate structure, the read transistor to read a state of the program transistor.

In accordance with one or more other embodiments, a memory device includes an anti-fuse device including a plurality of anti-fuse unit cells arranged in a two-dimensional (2D) array structure; a repair circuit to apply a program voltage to corresponding anti-fuse unit cells in the anti-fuse device based on a received address in a repair operation; and a memory cell block including a normal memory cell block and a spare memory cell block, spare memory cells in the spare memory cell block, rather than error memory cells in the normal memory cell block, are to be accessed due to redundancy information stored in the anti-fuse device, wherein each of the plurality of anti-fuse unit cells includes: a program transistor to execute a program based on insulation breakdown of a gate insulating layer that is based on the program voltage applied to the program transistor, and a read transistor, adjacent to the program transistor, to read a state of the program transistor, wherein at least one of a first gate electrode of the program transistor or a second gate electrode of the read transistor is buried in a substrate.

In accordance with one or more other embodiments, an anti-fuse device includes a first transistor in a first area; and a second transistor in a second area, wherein the first transistor has a first structure and the second transistor has a second structure different from the first structure, and wherein the first structure is a buried cell array transistor structure or a recessed channel array transistor structure.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
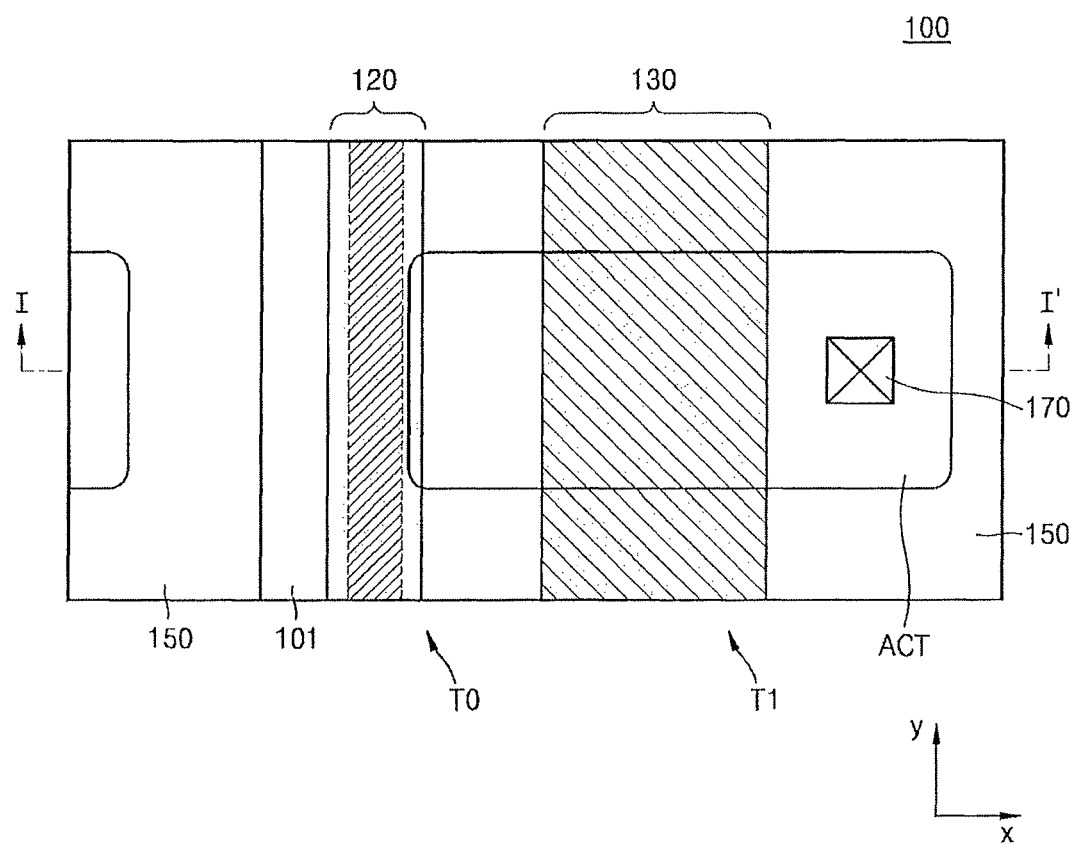
FIG. 1A illustrates an embodiment of an anti-fuse device.
Figure 1B:
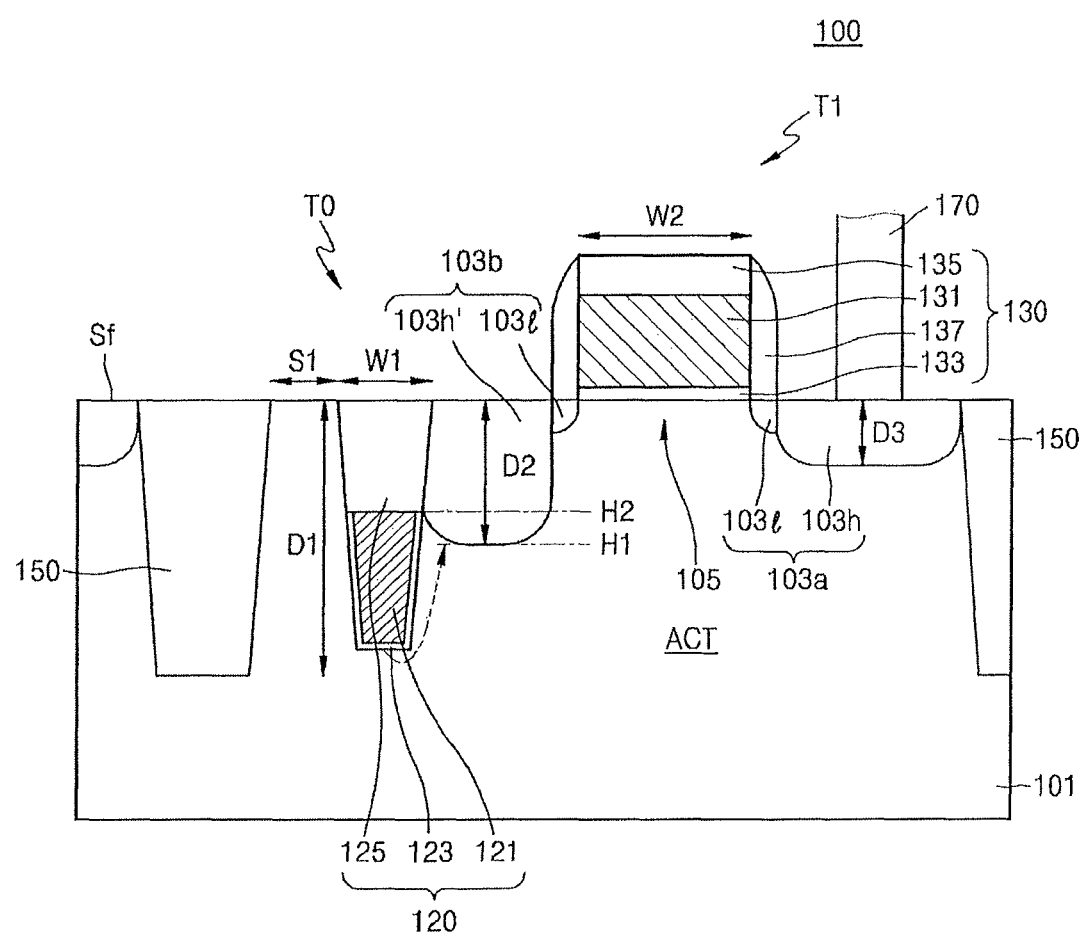
FIG. 1B illustrates a view taken along a line I-I' in FIG. 1A.

FIG. 1A illustrates an embodiment of an anti-fuse device 100, and FIG. 1B illustrates a cross-sectional view taken along line I-I' of FIG. 1A. Referring to FIGS. 1A and 1B, the anti-fuse device 100 may include a program transistor T0 and a read transistor T1 on a semiconductor substrate 101. The program transistor T0 and the read transistor T1 may form a unit cell of the anti-fuse device 100.

The semiconductor substrate 101 may correspond to a silicon bulk wafer or a silicon-on-insulator (SOI) wafer. In one embodiment, the semiconductor substrate 101 may include a Group IV semiconductor such as germanium (Ge), a Group IV-IV compound semiconductor such as silicon germanium (SiGe) or silicon carbide (SiC), or a Group III-V compound semiconductor such as gallium arsenide (GaAs), indium arsenide (InAs), or indium phosphide (InP). The semiconductor substrate 101 may correspond to a SiGe wafer, an epitaxial wafer, a polished wafer, or an annealed wafer.

The semiconductor substrate 101 may be, for example, a p-type substrate including p-type impurity ions. In one embodiment, the semiconductor substrate 101 may be an n-type substrate including n-type impurity ions. A shallow trench isolation (STI) 150 may be formed on an upper portion of the semiconductor substrate 101, as a device separation layer for defining an active area ACT. In one embodiment, the active area ACT may include an impurity region formed by injecting impurity ions (e.g., a dopant) into the semiconductor substrate 101 in a high concentration. For example, the active area ACT may include source/drain areas 103a and 103b formed by injecting impurity ions onto the upper portion of the semiconductor substrate 101 at different sides of a gate structure 130 of the read transistor T1 in a concentration equal to or greater than $1E20/cm^3$, and a channel area 105 below the gate structure 130. The source/drain areas 103a and 103b may include high concentration doped areas 103h and 103h' and a low concentration doped area 103l, e.g., a lightly doped drain (LDD) area.

The STI 150 may surround the active area ACT corresponding to the unit cell of the anti-fuse device 100. The STI 150 may be between active areas ACT to electrically separate the active areas ACT. The STI 150 may include, for example, a silicon oxide layer, a silicon nitride layer, a silicon oxynitride layer, or a combination thereof.

The unit cell of the anti-fuse device 100, as previously indicated, may include the program transistor T0 and the read transistor T1. The program transistor T0 may have a varying conductive state that changes, for example, from a high-resistance state to a low-resistance state based on electrical stress, such as a programming voltage or a blowing current. For example, the conductive state of the program transistor T0 may change from a high-resistance state to a low-resistance state by generating insulation breakdown of a gate insulating layer 123 based on a program voltage applied to the program transistor T0. The program transistor T0 may have the structure of a transistor, but may not perform the function of a general transistor.

In the anti-fuse device 100 according to the present embodiment, the program transistor T0 may include a gate structure 120 and the source/drain area 103b. The source/drain area 103b may be formed on only one side surface of the gate structure 120 in a direction in which the read transistor T1 is arranged. This is because, in the program transistor T0, the source/drain area 103b functions only as a current path and does not perform the source/drain function of a general transistor. Also, the source/drain area 103b is shared as a source area of the read transistor T1. Thus, the source/drain area 103b may be just a current path area in the program transistor T0 and may be a substantial source area in the read transistor T1.

As described above, the source/drain area 103b is formed by doping the upper portion of the semiconductor substrate 101 with impurity ions in a predetermined high concentration. Depending on a manufacturing process, source/drain areas may be formed at different sides of the gate structure 120. In addition, as illustrated in FIG. 1B, when the STI 150, rather than the source/drain area, is arranged at the other side of the gate structure 120, and no additional impurity area is formed between the STI 150 and the gate structure 120, the program transistor T0 may have one terminal in a floated state (e.g., refer to FIG. 2A). However, the program transistor T0 may also maintain a floated state when an impurity area is arranged between the STI 150 and the gate structure 120. The STI 150 may be spaced apart from the gate structure 120 by a first distance S1. Thus, an upper surface of the semiconductor substrate 101 may be exposed between the STI 150 and the gate structure 120.

The gate structure 120 may include a gate electrode 121, the gate insulating layer 123, and a capping layer 125. As illustrated in FIG. 1A, the gate structure 120 may extend in a second (e.g., Y) direction. The active area ACT in which the source/drain areas 103a and 103b are arranged may have an elongated shape in a first (e.g., X) direction in order to intersect the gate structure 120.

The gate electrode 121 may be buried in the semiconductor substrate 101 as illustrated in FIG. 1B, and may include a metal material such as tungsten (W). In one embodiment, the gate electrode 121 may be formed using metal materials other than W, or may be formed by using a non-metal material such as poly silicon. A transistor having a structure where gate electrode 121 is completely buried in the semiconductor substrate 101 may be referred to as a buried cell array transistor (BCAT). Thus, in the anti-fuse device 100 according to the present embodiment, it may be understood that the program transistor T0 has a BCAT structure.

The gate insulating layer 123 may be between the gate electrode 121 and the semiconductor substrate 101 and may surround the gate electrode 121. For example, the gate insulating layer 123 may surround the gate electrode 121 so that the gate electrode 121 is insulated from the semiconductor substrate 101. The gate insulating layer 123 may include an insulating material such as an oxide layer, a nitride layer, or an oxynitride layer. For example, in the anti-fuse device 100 according to the present embodiment, the gate insulating layer 123 may include a silicon oxide ($SiO_2$) layer.

The capping layer 125 may be on the gate electrode 121 and the gate insulating layer 123, and may be buried in the semiconductor substrate 101. The capping layer 125 may include an insulating material such as an oxide layer, a nitride layer, or an oxynitride layer. For example, in the anti-fuse device 100 according to the present embodiment, gate insulating layer 123 may include a silicon nitride (SiNx) layer.

The gate structure 120 may have a first depth D1 from an upper surface Sf of the semiconductor substrate 101. The depth of the gate structure may be less than the depth of the STI 150. For example, the first depth D1 of the gate structure 120 may be equal to or less than 100 mm. In the anti-fuse device 100 according to the present embodiment, the first depth D1 of the gate structure 120 may be, for example, about 60 to about 70 nm. The depth of the gate structure 120 may be different in another embodiment.

The read transistor T1 may include a gate structure 130, the source/drain areas 103a and 103b, and the channel area 105. The read transistor T1 may also be referred to as an access transistor or a path transistor. The gate structure 130 may include a gate electrode 131, a gate insulating layer 133, a capping layer 135, and a spacer 137. As illustrated in FIG. 1A, gate structure 130 may also extend in the second (Y) direction and may intersect the active area ACT having a long shape in the first (X) direction.

The gate electrode 131 may be formed on the upper surface Sf of the semiconductor substrate 101, with the gate insulating layer 133 interposed between the gate electrode 131 and the upper surface Sf of the semiconductor substrate 101. A transistor which has a structure in which the gate electrode 131 is formed on the upper surface Sf of the semiconductor substrate 101 is generally referred to as a planar transistor. Thus, in the anti-fuse device 100 according to the present embodiment, the read transistor T1 is understood to have a planar structure. The gate electrode 131 may include, for example, poly silicon. In one embodiment, the gate electrode 131 may include a metal material such as W.

The gate insulating layer 133 may be between the upper surface Sf of the semiconductor substrate 101 and the gate electrode 121, and may include an oxide layer, a nitride layer, or an oxynitride layer. For example, the gate insulating layer 133 may include a silicon oxide layer. The capping layer 135 may be on the gate insulating layer 133 and may include an oxide layer, a nitride layer, or an oxynitride layer. For example, the capping layer 135 may include a silicon nitride layer. The spacer 137 may be at different side surfaces of the gate electrode 131, the gate insulating layer 133, and the capping layer 135, and may include an insulating material such as an oxide layer, a nitride layer, or an oxynitride layer. For example, the spacer 137 may include a silicon oxide layer or a silicon oxynitride layer. Unlike FIG. 1B, the spacer 137 may have an L shape. Also, the spacer 137 may be formed as a single layer or multiple layers.

The source/drain areas 103a and 103b may be on an upper portion of the semiconductor substrate 101 at different side surfaces of the gate structure 130. The channel area 105 may be on an upper portion of the semiconductor substrate 101, below the gate structure 130 between the source area 103b and the drain area 103a. The read transistor T1 is a general transistor. Thus, the source/drain areas 103a and 103b and the channel area 105 may perform substantially the same functions as source/drain areas and a channel area of the general transistor. As illustrated in FIG. 1B, a contact 170 for connection with a bit line may be formed on the source/drain areas 103a and 103b, that is, the drain area 103a on the right side. The contact 170 may penetrate an interlayer insulating layer covering the gate structure 130 of the read transistor T1.

In the anti-fuse device 100 according to the present embodiment, the source area 103b of the read transistor T1 which is on the left side, and the drain area 103a of the read transistor T1 which is on the right side may have different depths. For example, the source area 103b on the left side may have a second depth D2 from the upper surface Sf of the semiconductor substrate 101. The drain area 103a on the right side may have a third depth D3 from the upper surface Sf of the semiconductor substrate 101. As illustrated in FIG. 1B, the second depth D2 of the source area 103b may be greater than the third depth D3 of the drain area 103a. For example, the second depth D2 of the source area 103b may be equal to or greater than 40 nm, and the third depth D3 of the drain area 103a may be about 20 to about 30 nm. The depths of the source area 103b and the drain area 103a may be different in other embodiments.

In the anti-fuse device 100 according to the present embodiment, the reason that the source area 103b is deeper than the drain area 103a may be due to the BCAT structure of the program transistor T0. For example, since the gate electrode 121 of the program transistor T0 is buried in the semiconductor substrate 101, when the distance between the gate electrode 121 (e.g., a lower surface of the gate electrode 121) and the source area 103b increases, insulation breakdown of the gate insulating layer 123 may be difficult and a current path after the insulation breakdown may increase. In general, the insulation breakdown of the gate insulating layer 123 based on a program voltage occurs at a lower surface portion of the gate electrode 121. Accordingly, a current path (illustrated by dotted arrows) may be generated. Thus, in order to easily generate the insulation breakdown and decrease the current path, the source area 103b may be formed to be deeper than the drain area 103a. For example, as illustrated FIG. 1B, the height H1 of a lower surface of the source area 103b may be less than the height of an upper surface of the gate electrode 121.

In the anti-fuse device 100 according to the present embodiment, the program transistor T0 may have a BCAT structure. Thus, the total area of the anti-fuse device 100 may be significantly decreased. For example, in the case of a previous anti-fuse device, the program transistor T0 is formed as a planar structure along with the read transistor T1. In the case of a planar structure, in order to meet the required electrical characteristic, there is a limit to how much the width of a gate structure (e.g., width of a gate electrode) may be reduced.

For example, in the previous anti-fuse device, the program transistor T0 and the read transistor T1 have a planar structure and a gate structure, with a width of at least about 45 to about 50 nm. In this case, it may be difficult or impossible to reduce the width any further.

On the contrary, in the case of the anti-fuse device 100 according to the present embodiment, the program transistor T0 has a BCAT structure. Thus, the limitation concerning reduction of the width of the gate structure may be solved. For example, in the anti-fuse device 100 according to the present embodiment, the gate structure 120 of the program transistor T0 may have a first width W1 in the first (X) direction equal to or less than 30 nm. However, in the case of the read transistor T1, since the electrical characteristic of the transistor has to be maintained, the read transistor T1 may have a second width W2 which is still around 50 nm in the first (X) direction. The electrical characteristic of the read transistor T1 is an on-current characteristic of a transistor. For example, an on-current of the read transistor T1 may be equal to or higher than 20 μA. Thus, according to the present embodiment, the anti-fuse device 100 may have a significantly reduced total size, while at the same time allowing predetermined (e.g., high) operation speed to be achieved.

In addition, in the anti-fuse device 100 according to the present embodiment, the program transistor T0 having a BCAT structure and the read transistor T1 having a planar structure may form one unit cell. The anti-fuse device 100 may have a two-dimensional (2D) array structure by repetitively forming unit cells with this structure. Thus, the anti-fuse device 100 according to the present embodiment may be advantageous for realizing a pitched layout, with regard to a layout of an anti-fuse device. Also, the anti-fuse device 100 according to the present embodiment may be advantageous in terms of a manufacturing process, since the program transistor T0 and read transistor T1 may be formed by a complementary metal-oxide semiconductor (CMOS) process.

Figure 2A:
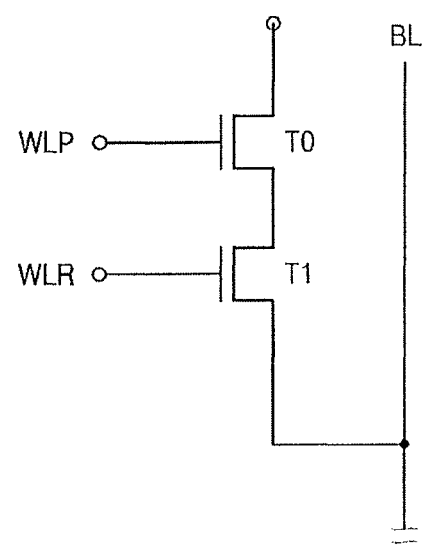
FIGS. 2A and 2B illustrate examples of circuit diagrams for describing operation of the anti-fuse device.
Figure 2B:
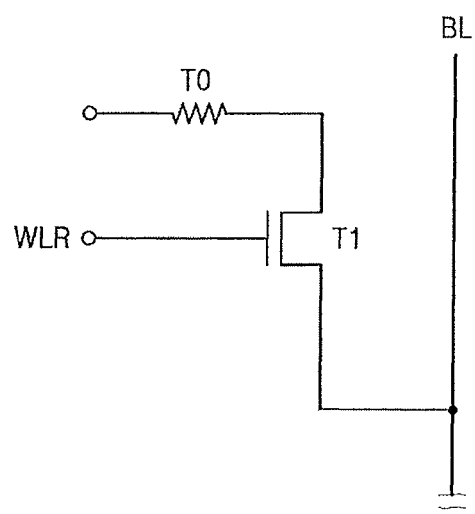

FIGS. 2A and 2B illustrate embodiments of circuit diagrams for describing operation of the anti-fuse device 100 of FIG. 1. Before a program voltage is applied to the gate structure in a first area (e.g., word line program (WLP) area) of the program transistor T0 as illustrated in FIG. 2A, a high-resistance state is maintained between the gate structure WLP and the source/drain area 103b due to the gate insulating layer (123 of FIG. 1B). Thus, when a predetermined voltage is applied between the gate structure WLP of the program transistor T0 and a bit line BL, and an operation voltage is applied to a gate structure of a second area (e.g., word line read (WLR) area) of the read transistor T1, the amount of current flowing to the bit line BL may be reduced.

When a high program voltage is applied to the gate structure WLP of the program transistor T0, insulation breakdown of the gate insulating layer 123 occurs. As a result, the program transistor T0 may change to a low-resistance state. In FIG. 2B, the program transistor T0 is illustrated as a resistor, rather than a transistor, in order to indicate that the program transistor T0 is changed to a low-resistance state. When the program transistor T0 is changed to the low-resistance state, and when a predetermined voltage is applied between the gate structure WLP of the program transistor T0 and the bit line BL, and an operation voltage is applied to the gate structure WLR of the read transistor T1, the current flowing to the bit line BL may be relatively high. Thus, the anti-fuse device 100 may be changed from an off-state (e.g., a small current state) to an on-state (e.g., a high current state) when the high program voltage is applied to the program transistor T0.

The anti-fuse device 100 is to have a 2D array structure including the unit cells, with each unit cell formed by or including one program transistor T0 and one read transistor T1. Each unit cell may correspond, for example, to a memory cell of a memory device. Accordingly, when errors occur in the memory cells of the memory device, the memory cells in which the errors occur may be replaced by redundancy memory cells or spare memory cells, by changing states of corresponding unit cells of the anti-fuse device 100 from an off-state to an on-state.

Figure 3A:
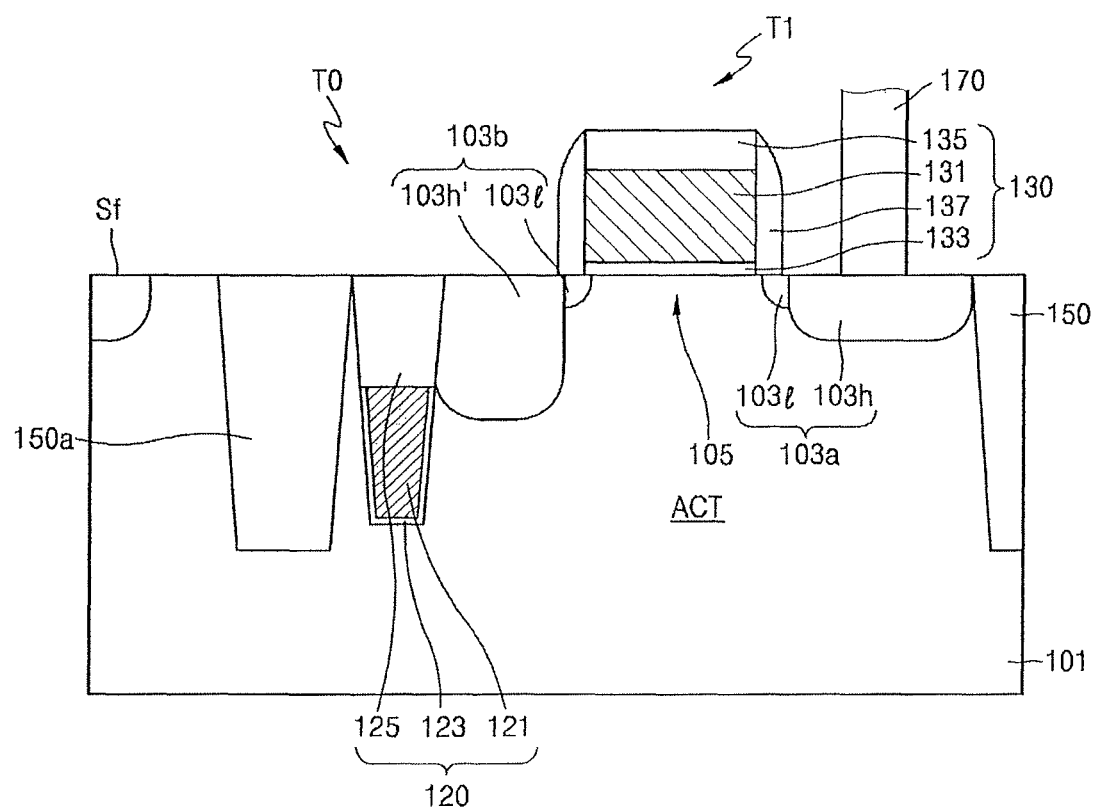
FIGS. 3A to 12 illustrate additional embodiments of an anti-fuse device.

FIGS. 3A to 12 illustrate cross-sectional views of additional embodiments of an anti-fuse device. Referring to FIG. 3A, an anti-fuse device 100a according to the present embodiment may differ from the anti-fuse device 100 of FIG. 1B in terms of the distance by which a STI 150a is spaced apart from the program transistor T0. For example, in the anti-fuse device 100a according to the present embodiment, the STI 150a may be formed to contact a side surface of the gate structure 120 of the program transistor T0. For example, as illustrated in FIG. 3A, an upper portion of the STI 150a and an upper portion of the gate structure 120 (e.g., an upper portion of the capping layer 125) may contact each other. Accordingly, the semiconductor substrate 101 between the STI 150a and the gate structure 120 may not be exposed.

The program transistor T0 does not perform functions of a general transistor. Thus, a source/drain area does not need to be formed at a side of the anti-fuse device 100a at which the STI 150a is arranged. Thus, as shown in the anti-fuse device 100a according to the present embodiment, no functional problems may occur even when the STI 150a contacts the side surface of the gate structure 120. Also, in comparison to the anti-fuse device 100 of FIG. 1B, a first distance S1 by which the STI 150a is spaced apart from the gate structure 120 in the first (X) direction decreases. Thus, the area of the anti-fuse device 100a may be reduced.

Figure 3B:
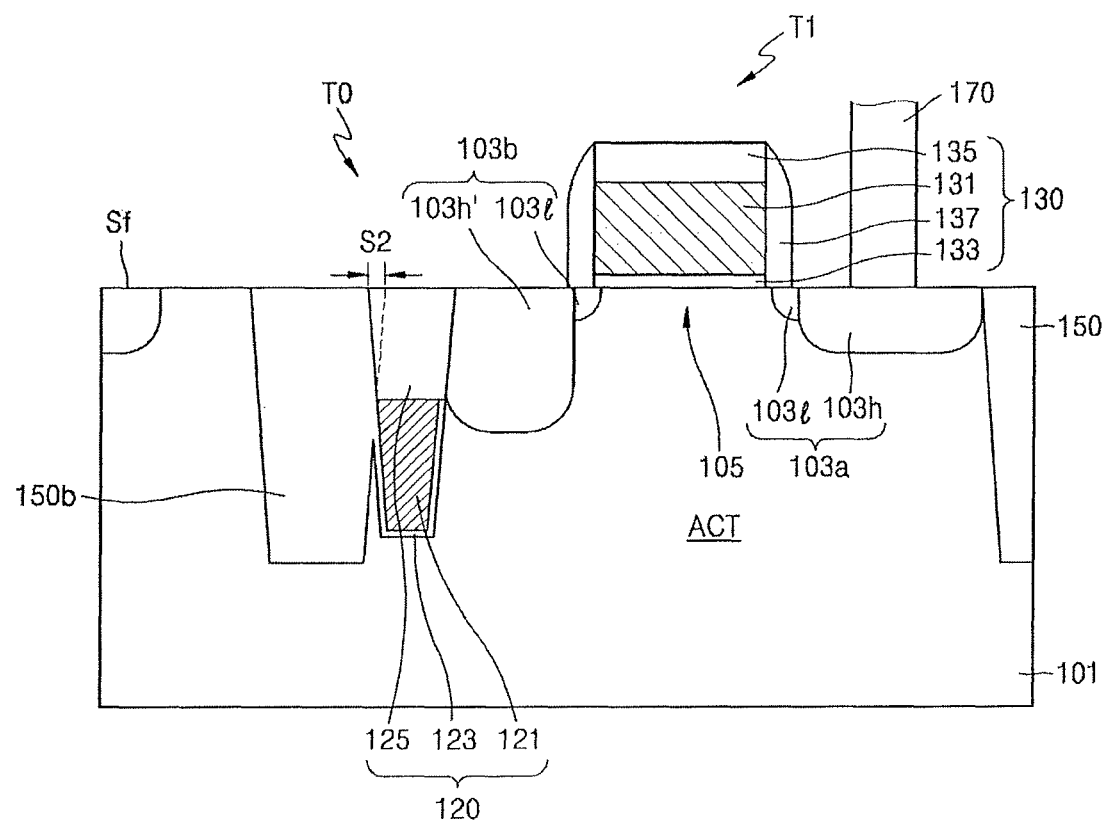

Referring to FIG. 3B, the anti-fuse device 100b according to the present embodiment may differ from the anti-fuse devices 100 and 100a of FIGS. 1B and 3A in terms of the distance by which a STI 150b is spaced apart from the program transistor T0. For example, in the anti-fuse device 100b according to the present embodiment, the STI 150b may be formed to overlap a portion of the gate structure 120 of the program transistor T0. For example, as illustrated in FIG. 3B, an upper portion of the STI 150b overlaps an upper portion of the capping layer 125 of the gate structure 120. The width by which the STI 150b and the gate structure 120 overlap each other may be a second distance S2 in the first (X) direction based on an upper surface of the capping layer 125. In terms of the function of the program transistor T0, when STI 150b does not intrude into the source/drain area 103b on the right side of the gate structure 120, the second distance S2 may not be greatly restricted.

For reference, the dotted line in the capping layer 125 does not indicate the portion in which the STI 150b is actually formed, but indicates a range in which the STI 150b overlaps the capping layer 125. For example, when the gate insulating layer 123 of the gate structure 120 includes a silicon oxide layer, the capping layer 125 includes a silicon nitride layer and the STI 150b includes a silicon oxide layer, and a boundary of the STI 150b and the gate insulating layer 123 is not shown as illustrated in FIG. 3B. The capping layer 125 may be intact while an upper right side of the STI 150b may intrude into the capping layer 125. On the contrary, when the STI 150b includes a silicon nitride layer, the boundary of the STI 150b and the gate insulating layer 123 may be shown, and a boundary of the STI 150b and capping layer 125 may not be shown.

In the anti-fuse device 100b according to the present embodiment, the semiconductor substrate 101 is not exposed between the STI 150b and the gate structure 120. In comparison to the anti-fuse device 100 of FIG. 1B, the first distance S1 by which the STI 150a is spaced apart from the gate structure 120 in the first (X) direction decreases. Also, the second distance S2 by which the STI 150b and the gate structure 120 overlap each other decreases, which may further contribute to reducing the area of the anti-fuse device 100b.

Figure 4:
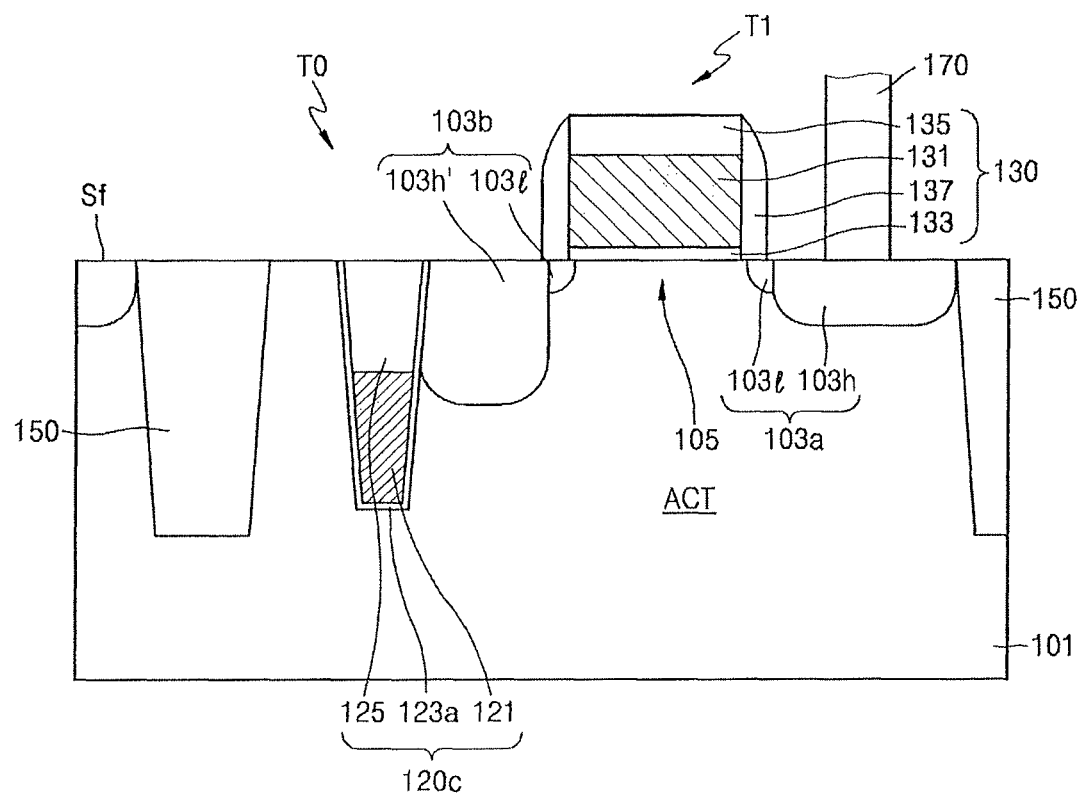

Referring to FIG. 4, the anti-fuse device 100c according to the present embodiment may differ from the anti-fuse device 100 of FIG. 1B in terms of a structure of a gate structure 120c of the program transistor T0. For example, in the anti-fuse device 100c according to the present embodiment, a gate insulating layer 123a of the gate structure 120c may surround not only a side surface of the gate electrode 121 but also a side surface of the capping layer 125. The structure of the gate insulating layer 123a may be realized by not removing, but maintaining, a gate insulating layer, while removing an upper portion of the gate electrode 121 in a process of forming the gate structure 120c.

Figure 5:
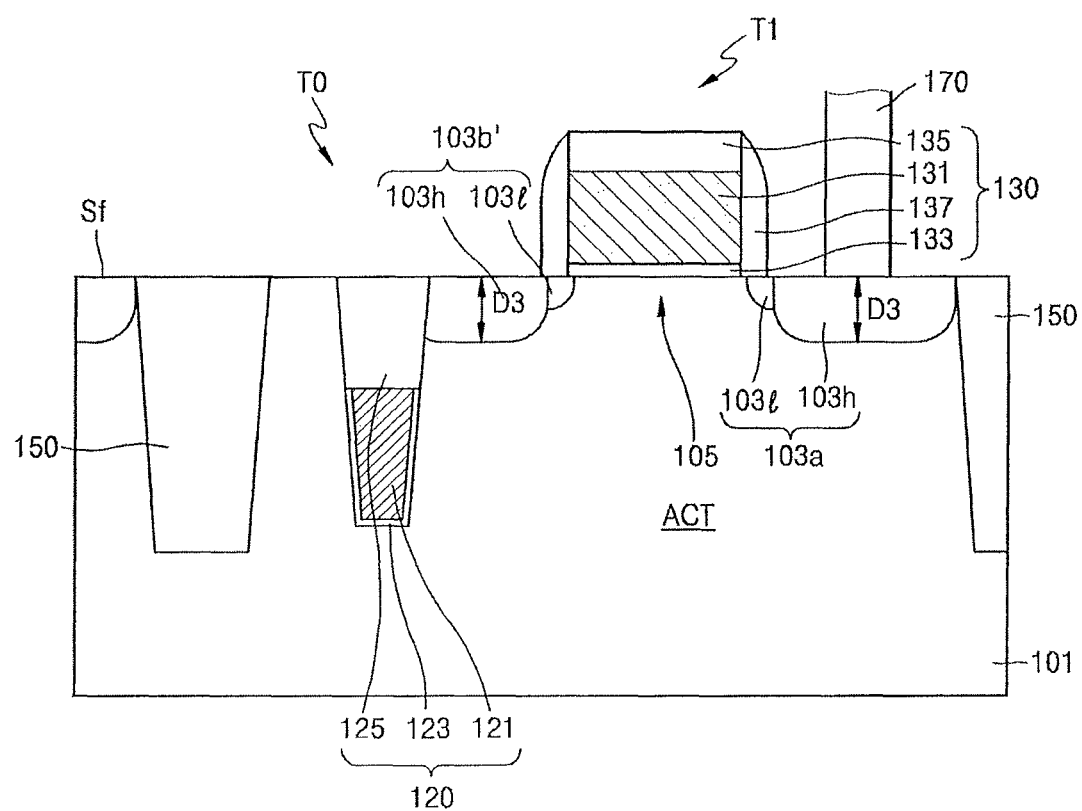

Referring to FIG. 5, the anti-fuse device 100d according to the present embodiment may differ from the anti-fuse device 100 of FIG. 1B in terms of a structure of a source/drain area 103b' shared between the program transistor T0 and the read transistor T1. For example, in the anti-fuse device 100d according to the present embodiment, the source area 103b' of the read transistor T1 may have substantially the same depth as the drain area 103a. For example, the source area 103b' of the read transistor T1 may have a third depth D3 equal to that of the drain area 103a.

If insulation breakdown of the program transistor T0 occurs and current characteristics are maintained after the insulation breakdown, the depth of the source/drain area of the program transistor T0 (e.g., the source area of the read transistor T1) may not be a significant problem. Thus, in the anti-fuse device 100d according to the present embodiment, the source area 103b' of the read transistor T1 may have substantially the same depth as the drain area 103a. Also, as illustrated in FIG. 5, the lower surface of the source area 103b' of the read transistor T1 may be higher than the upper surface of the gate electrode 121 of the gate structure 120 of the program transistor T0.

As in the case of the anti-fuse device 100d according to the present embodiment, when the source area 103b' of the read transistor T1 and the drain area 103a have the same depth, an impurity ion injection process for forming the source area 103b' and the drain area 103a may become less complicated. For example, the source/drain areas 103a and 103b' of the read transistor T1 may be more easily formed by performing the impurity ion injection process using the gate structure 120 as a mask, without an additional mask pattern.

Figure 6A:
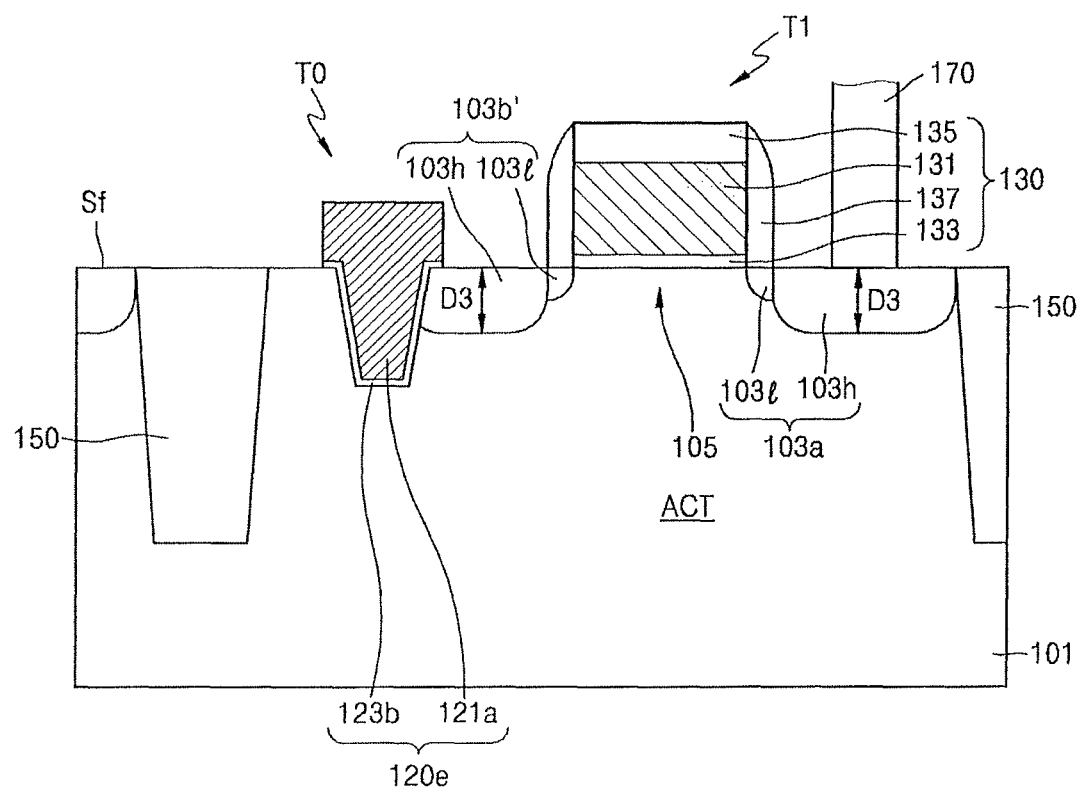

Referring to FIG. 6A, the anti-fuse device 100e according to the present embodiment may differ from the anti-fuse device 100 of FIG. 1B, in that the anti-fuse device 100e has the program transistor T0 having a recessed channel array transistor (RCAT) structure. For example, in the anti-fuse device 100e according to the present embodiment, a gate structure 120e of the program transistor T0 may include a gate electrode 121a and a gate insulating layer 123b, and only a lower portion of the gate electrode 121a is buried in the semiconductor substrate 101.

Figure 6B:
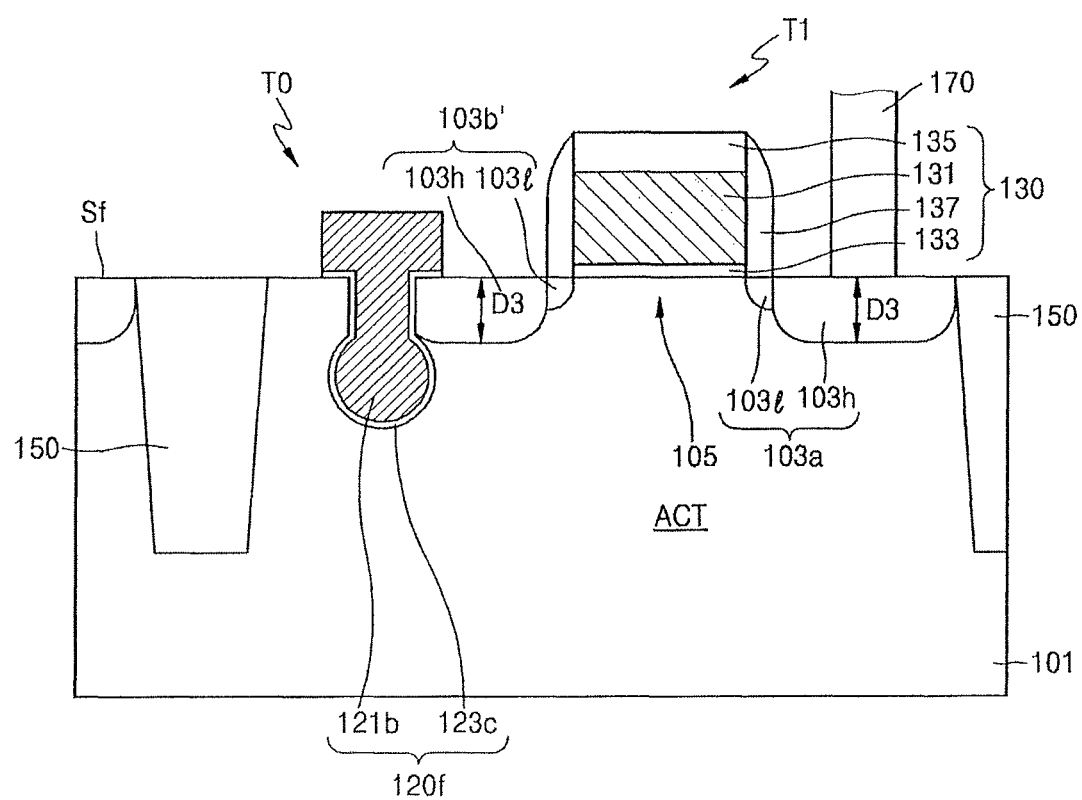

In general, a transistor having a structure in which a gate electrode is completely buried in the semiconductor substrate 101 may be referred to as a BCAT. A transistor having a structure in which only a portion of the gate electrode is buried in the semiconductor substrate 101 may be referred to as a RCAT. In one embodiment, a BCAT may be developed from a RCAT or a spherical RCAT (SRCAT) as illustrated in FIG. 6B. All transistors having the structure of the gate electrode filling a trench in the semiconductor substrate 101 may be interpreted as an RCAT. When an RCAT is interpreted as such, the BCAT and SRCAT may also be included in the RCAT.

In the anti-fuse device 100e according to the present embodiment, the gate electrode 121a of the gate structure 120e of the program transistor T0 may include a metal material, such as poly silicon or tungsten. The materials of the gate electrode 121a may be different in another embodiment.

In the anti-fuse device 100e according to the present embodiment, the depth by which the gate structure 120e (e.g., the gate electrode 121a) is buried from the upper surface Sf of the semiconductor substrate 101 may be less than the depth of the gate structure 120 of the anti-fuse device 100 of FIG. 1B. Also, the source/drain area 103b' of the program transistor T0 (e.g., the source area 103b' of the read transistor T1) may have the third depth D3 which equal to that of the drain area 103a. In one embodiment, the source area 103b' of the read transistor T1 may have a depth that is greater than the third depth D3. For example, the source area 103b' of the read transistor T1 may have the second depth D2 as in the case of the anti-fuse device 100 of FIG. 1B.

The anti-fuse device 100e according to the present embodiment has the program transistor T0 having the RCAT structure. Thus, the overall area of the anti-fuse device 100e may be reduced. Also, the anti-fuse device 100e may be more advantageous to realize a pitched layout with regard to a layout of an anti-fuse device.

Referring to FIG. 6B, the anti-fuse device 100f according to the present embodiment may differ from the anti-fuse device 100 of FIG. 1B in that the anti-fuse device 100f has the program transistor T0 having the SRCAT structure. For example, in the anti-fuse device 100f according to the present embodiment, a gate structure 120f of the program transistor T0 has a structure in which a lower portion of a gate electrode 121b has a spherical shape. The gate electrode 121b is buried in the semiconductor substrate 101, with the gate insulating layer 123c between the gate electrode 121b and the semiconductor substrate 101. The transistor including the gate structure 120f having this structure may be referred to as the SRCAT, to distinguish it from an RCAT. However, this transistor may also be included in the RCAT, as described above.

Figure 6C:
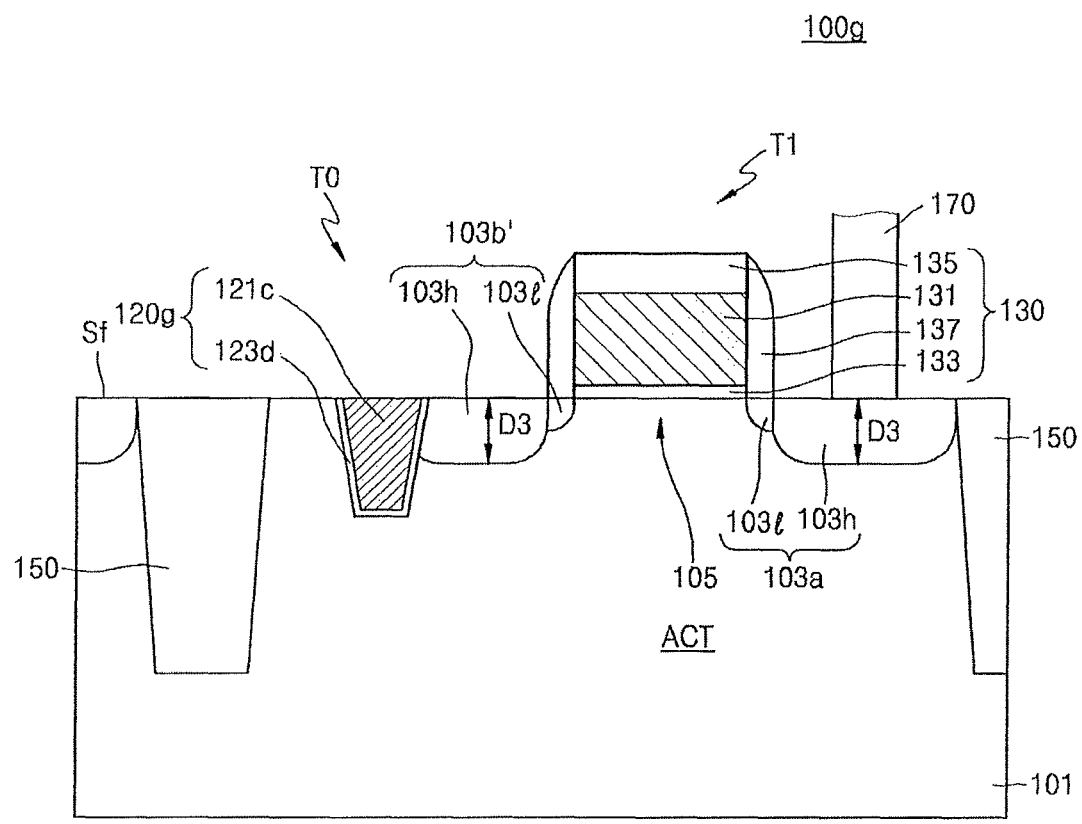

Referring to FIG. 6C, the anti-fuse device 100g according to the present embodiment may differ from the anti-fuse device 100e of FIG. 6A in terms of a structure of a gate structure 120g of the program transistor T0. For example, in the anti-fuse device 100g according to the present embodiment, the gate structure 120g may include a gate electrode 121c and a gate insulating layer 123d. Upper surfaces of the gate electrode 121c and the gate insulating layer 123d may form substantially the same planes as an upper surface of the semiconductor substrate 101. The gate structure 120g having this structure may be realized via a planarization process, such as chemical mechanical polishing (CMP), after filling a trench in the semiconductor substrate 101 with a gate electrode material.

Figure 7:
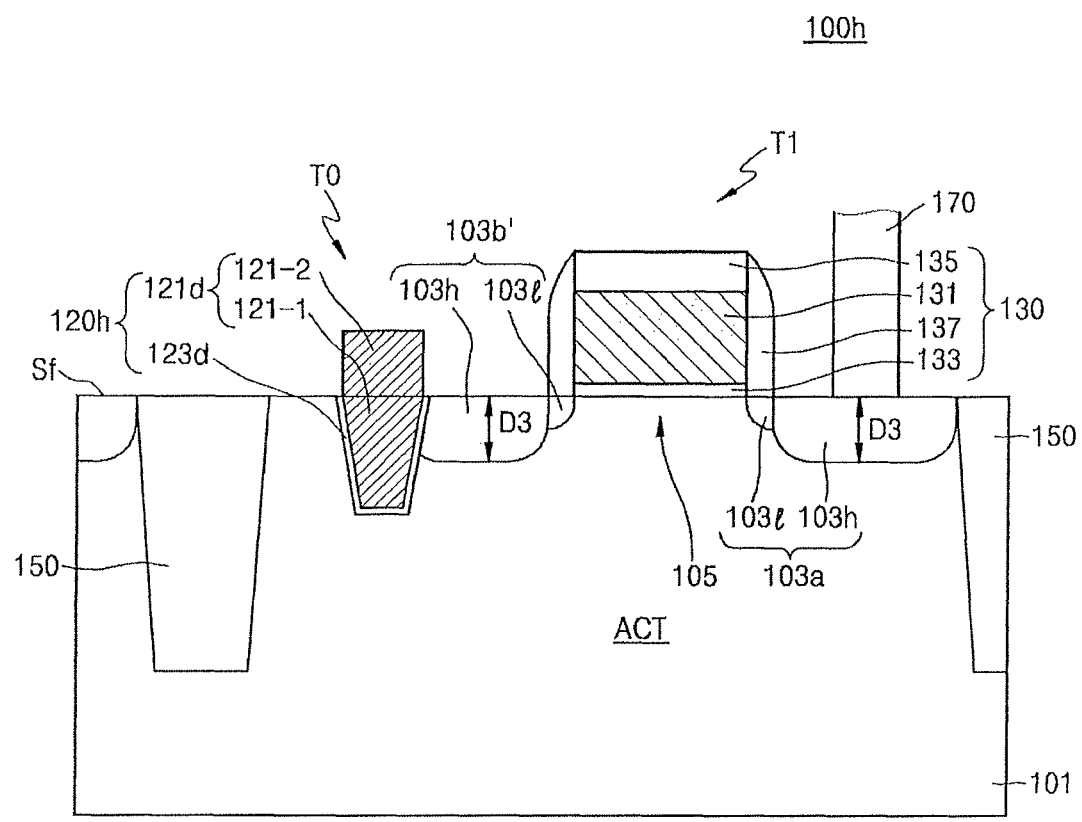

Referring to FIG. 7, the anti-fuse device 100h according to the present embodiment may differ from anti-fuse device 100e of FIG. 6A in terms of a structure of a gate structure 120h of the program transistor T0. For example, in the anti-fuse device 100h according to the present embodiment, the gate structure 120h may include a gate electrode 121d having a double-layered structure and a gate insulating layer 123d. The double-layered structure may include a lower gate electrode 121-1 and an upper gate electrode 121-2. The lower gate electrode 121-1 may include poly silicon, and the upper gate electrode 121-2 may include a metal material such as W. The gate structure 120h with this structure may be realized by forming a gate structure with the same structure as gate structure 120g in FIG. 6C and then patterning a metal layer thereon.

Figure 8:
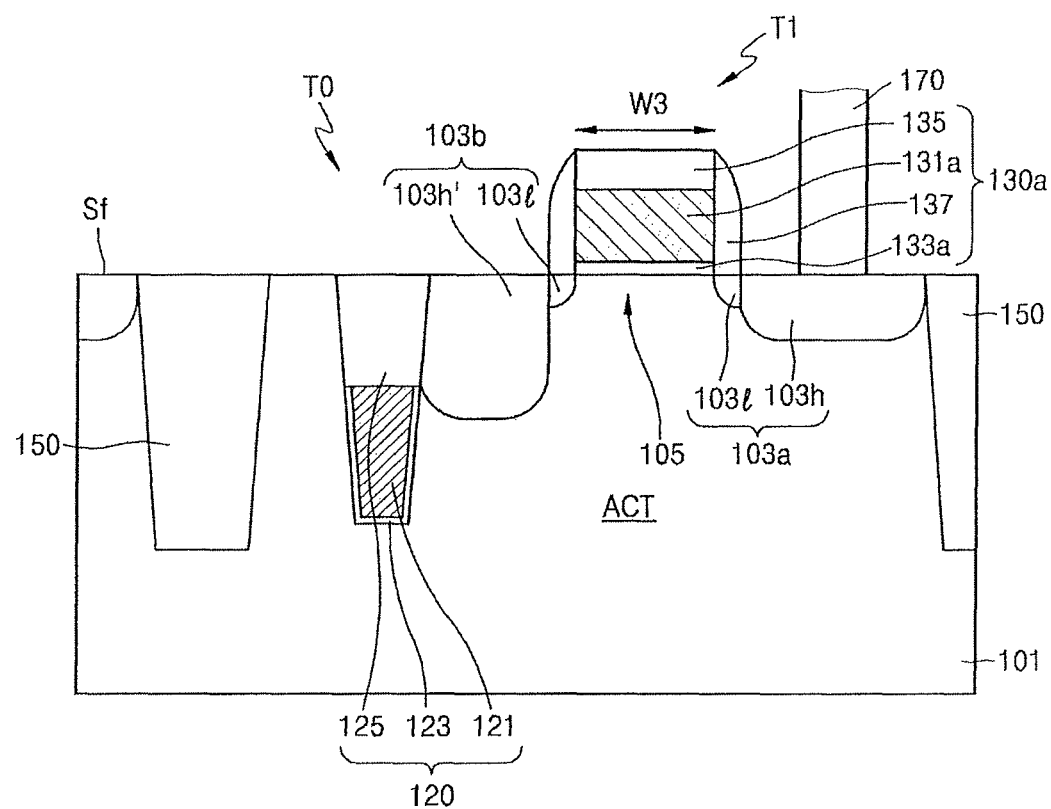

Referring to FIG. 8, the anti-fuse device 100i according to the present embodiment may differ from the anti-fuse device 100 of FIG. 1A, in terms of a structure of a gate structure 130a of the read transistor T1. For example, in the anti-fuse device 100i according to the present embodiment, the gate structure 130a of the read transistor T1 may implement a high-k metal gate (HKMG) structure. The HKMG structure may be, for example, a structure formed by forming a gate insulating layer 133a using a high-k material and forming a gate electrode 131a using a metal material.

The gate insulating layer 133a may be formed, for example, using the high-k material, such as $HfO_2$, $HfSiO_4$, HfSiON, HfON, HfAlO, HfLaO, $ZrO_2$, $ZrSiO_4$, $TaO_2$, $Ta_2O_5$, $Al_2O_3$, $La_2O_3$, $TiO_2$, $Y_2O_3$, etc.

The gate electrode 131a may be formed using metal material such as W. Also, the gate electrode 131a may be formed using TiN, rather than W, or a different material.

When the gate structure 130a is formed to have an HKMG structure, due to characteristics of an HKMG structure, electrical characteristics for operation may be obtained even when the size of the gate structure is reduced. Thus, in the anti-fuse device 100i according to the present embodiment, the gate structure 130a may have a third width W3 in a first (X) direction. The third width W3 may be less than the second width W2 of the gate structure 130 of read transistor T1 of FIG. 1B. For example, gate structure 130a may have a width equal to or less than 40 nm in the first (X) direction.

The anti-fuse device 100i according to the present embodiment has the read transistor T1 having the HKMG structure. Thus, even when the read transistor T1 has a planar structure, the overall area of the anti-fuse device may be less than that of the anti-fuse device 100 of FIG. 1A.

Figure 9:
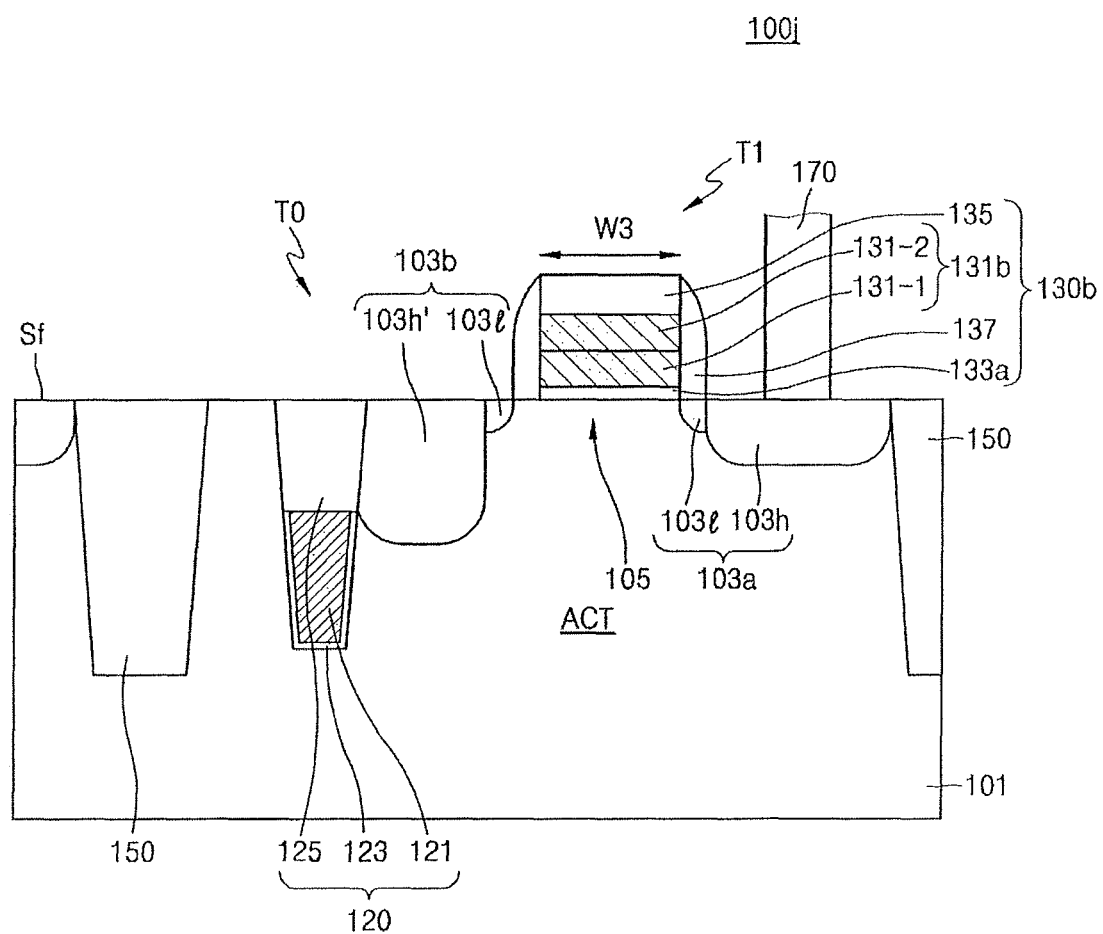

Referring to FIG. 9, the anti-fuse device 100j according to the present embodiment may differ from the anti-fuse device 100i of FIG. 8 in terms of the gate structure 130b of the read transistor T1. For example, in the anti-fuse device 100j, the gate structure 130b of the read transistor T1 may be formed with an HKMG structure and may include a gate electrode 131b having a double layer. Thus, gate electrode 131b may include a lower metal layer 131-1 and an upper metal layer 131-2.

The lower metal layer 131-1 may include TiN and the upper metal layer 131-2 may include W. In one embodiment, the lower metal layer 131-1 may include a metal layer including an Al compound containing Ti or Ta. For example, the lower metal layer 131-1 may be a metal layer including TiAlC, TiAlN, TiAlC—N, TiAl, TaAlC, TaAlN, TaAlC—N, or TaAl. Also, the lower metal layer 131-1 may include a metal layer including Mo, Pd, Ru, Pt, TiN, WN, TaN, Ir, TaC, RuN, or MoN. In some cases, the upper metal layer 131-2 may be omitted, and only the lower metal layer 131-1 may be included in the gate electrode 131b. The lower metal layer 131-1 may be a single layer or may be formed from multiple layers.

Figure 10:
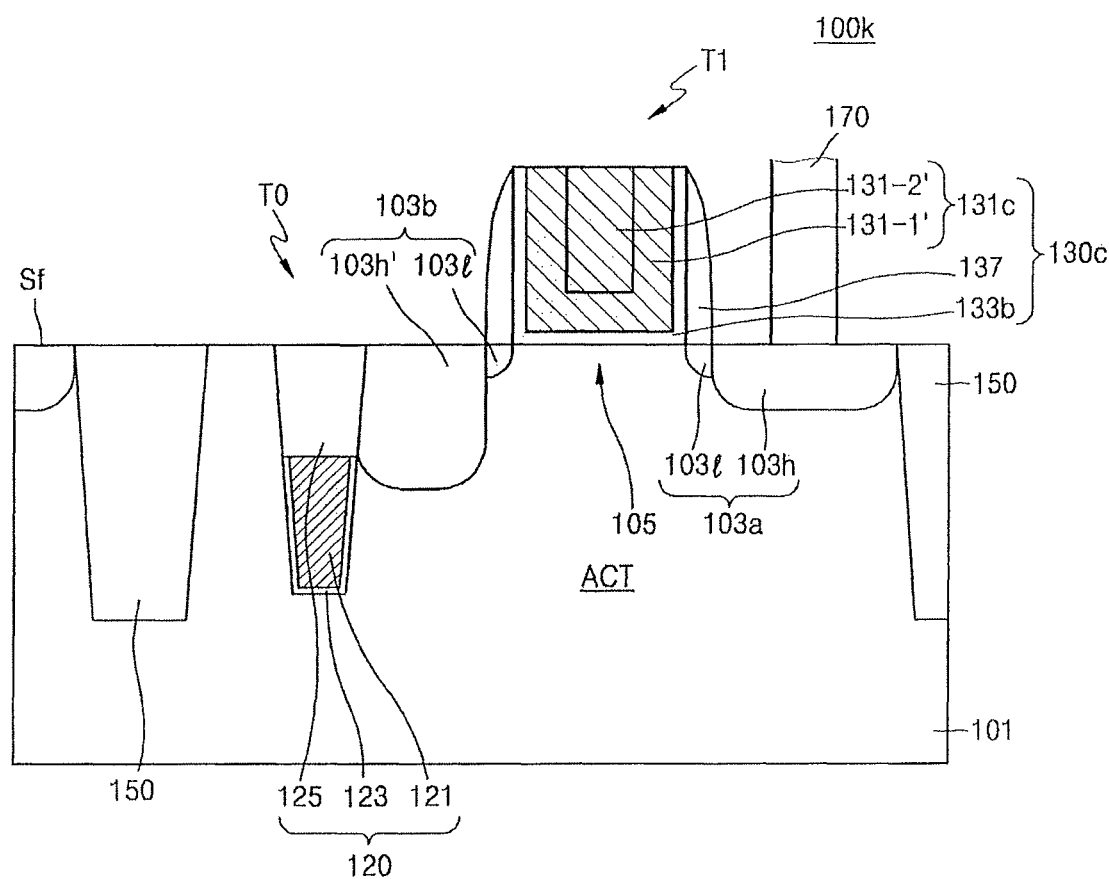

Referring to FIG. 10, the anti-fuse device 100k according to the present embodiment may differ from the anti-fuse device 100i of FIG. 8 or the anti-fuse device 100j of FIG. 9 in terms of a gate structure 130c of the read transistor T1. For example, in the anti-fuse device 100k according to the present embodiment, the gate structure 130c of the read transistor T1 may be a replacement metal gate (RMG) structure, based on a HKMG structure. The RMG structure may be formed by forming a source/drain area using a dummy gate structure and, then, forming a metal gate at a portion from which a dummy gate is removed, and thus may be referred to as a gate last structure.

In the anti-fuse device 100k according to the present embodiment, since the gate structure 130c is formed as the RMG structure, a gate insulating layer 133b has a structure that covers an upper surface of the semiconductor substrate 101 and a side wall of the spacer 137. A gate electrode 131c may have a structure that covers a bottom surface and a side wall of a gate insulating layer 133b that is below the gate electrode 131c. The gate electrode 131c may have a double-layered structure, including a lower metal layer 131-1' and an upper metal layer 131-2'. The lower metal layer 131-1' may cover the bottom surface and the side wall of the gate insulating layer 133b. The upper metal layer 131-2' may fill the lower metal layer 131-1'.

Materials of the lower metal layer 131-1' and the upper metal layer 131-2' are the same as described with reference to the lower metal layer 131-1 and the upper metal layer 131-2 of FIG. 9. Also, as described with reference to FIG. 9, the upper metal layer 131-2' may be omitted, only the lower metal layer 131-1' may be included in the gate electrode 131c, and the lower metal layer 131-1' may include two or more layers.

Figure 11:
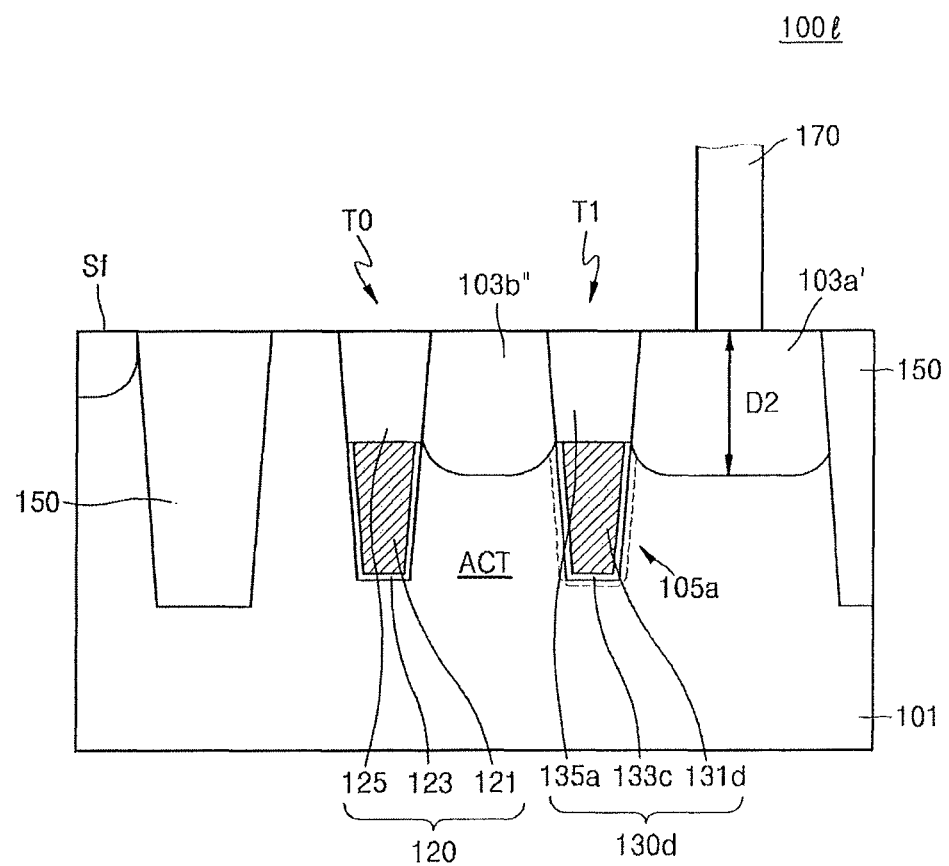

Referring to FIG. 11, the anti-fuse device 100l according to the present embodiment may completely differ from the anti-fuse devices 100, and 100A through 100K according to the above embodiments, in that the anti-fuse device 100l has the read transistor T1 having a BCAT structure. For example, in the anti-fuse device 100l according to the present embodiment, the read transistor T1 may include a gate structure 130d, source/drain areas 103a' and 103b'', and a channel area 105a.

The gate structure 130d may include a gate electrode 131d, a gate insulating layer 133c, and a capping layer 135a, and may have a structure in which the gate electrode 131d is completely buried in the semiconductor substrate 101 as the gate structure 120 of the program transistor T0. For example, the read transistor T1 may have a BCAT structure. In the anti-fuse device 100l according to the present embodiment, the read transistor T1 may implement an HKMG structure to obtain current characteristics. Accordingly, the gate insulating layer 133c may be formed using a high-k thin layer and the gate electrode 131d may be formed using a metal material. Materials of the gate insulating layer 133c and the gate electrode 131d may be the same as described with reference to FIG. 8.

The capping layer 135a may include an insulating material, such as an oxide layer, a nitride layer, or an oxynitride layer. For example, the capping layer 135a may include a silicon nitride layer.

The source/drain areas 103a' and 103b'' may be formed on an upper portion of the semiconductor substrate 101 at different sides of the gate structure 130d. As illustrated in FIG. 11, the drain area 103a' may be deeper than the drain area 103a of the read transistor T1 having the planar structure of FIG. 1. For example, the drain area 103a' may have the second depth D2 which is substantially the same as a depth of the source area 103b''. One reason the drain area 103a' may be formed to have a great depth is to improve electrical characteristics of the read transistor T1. Also, when the drain area 103a' has the same depth as the source area 103b'', a process of injecting impurity ions may become less complicated and, thus, process difficulty may be lowered.

The channel area 105a may be adjacent to the gate electrode 131d of the gate structure 130d to surround the gate electrode 131d, as indicated by dotted lines.

In the anti-fuse device 100l according to the present embodiment, the program transistor T0 and the read transistor T1 have a BCAT structure. Thus, the total size of the anti-fuse device 100l may be reduced. Also, in the anti-fuse device 100l according to the present embodiment, the read transistor T1 includes gate structure 130d having an HKMG structure and source/drain areas 103a' and 103b'' formed to be relatively deep. Thus, read transistor T1 may maintain substantially the same electrical characteristics as when the read transistor T1 has the planar structure. Further, since the program transistor T0 and the read transistor T1 have a BCAT structure and the source/drain areas 103a' and 103b'' have the same depth, the difficulty of the manufacturing process may be significantly reduced. Also, the anti-fuse device 100l according to the present embodiment may be advantageous for realizing a pitched layout.

In the anti-fuse device 100l according to the present embodiment, the HKMG structure of the gate structure 130d of the read transistor T1 was described. However, the HKMG structure may also be applied to the program transistor T0, in addition to the read transistor T1. When the gate structure 120 of the program transistor T0 has the HKMG structure, program transistor T0 and read transistor T1 may have substantially the same structure. Accordingly, the anti-fuse device 100l according to the present embodiment may be easily formed using, for example, a CMOS process.

Figure 12:
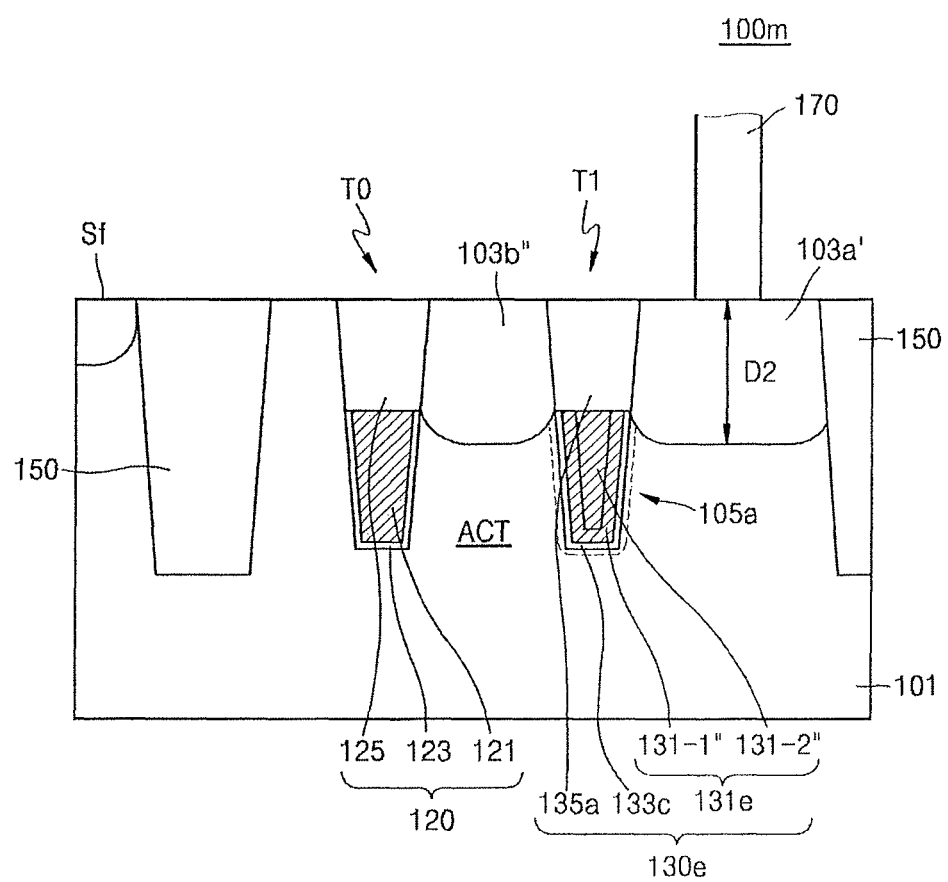

Referring to FIG. 12, the anti-fuse device 100m according to the present embodiment may differ from the anti-fuse device 100l of FIG. 11 in terms of a gate structure 130e of the read transistor T1. For example, in the anti-fuse device 100m, the gate structure 130e of the read transistor T1 may include the gate insulating layer 133c, a gate electrode 131e having a double-layered structure, and a capping layer 135a. That is, the gate electrode 131e may include a lower metal layer 131-1'' and an upper metal layer 131-2''. The lower metal layer 131-1'' may have a structure that surrounds a lower surface and a side wall of the gate insulating layer 133c. The upper metal layer 131-2'' may have a structure that fills the lower metal layer 131-1''. Materials of the lower metal layer 131-1'' and the upper metal layer 131-2'' may be the same as described with reference to the lower metal layer 131-1 and the upper metal layer 131-2 of FIG. 9. Also, as described with reference to FIG. 9, the upper metal layer 131-2" may be omitted, only the lower metal layer 131-1" may be included in the gate electrode 131c, and the lower metal layer 131-1" may include two or more layers.

Figure 13:
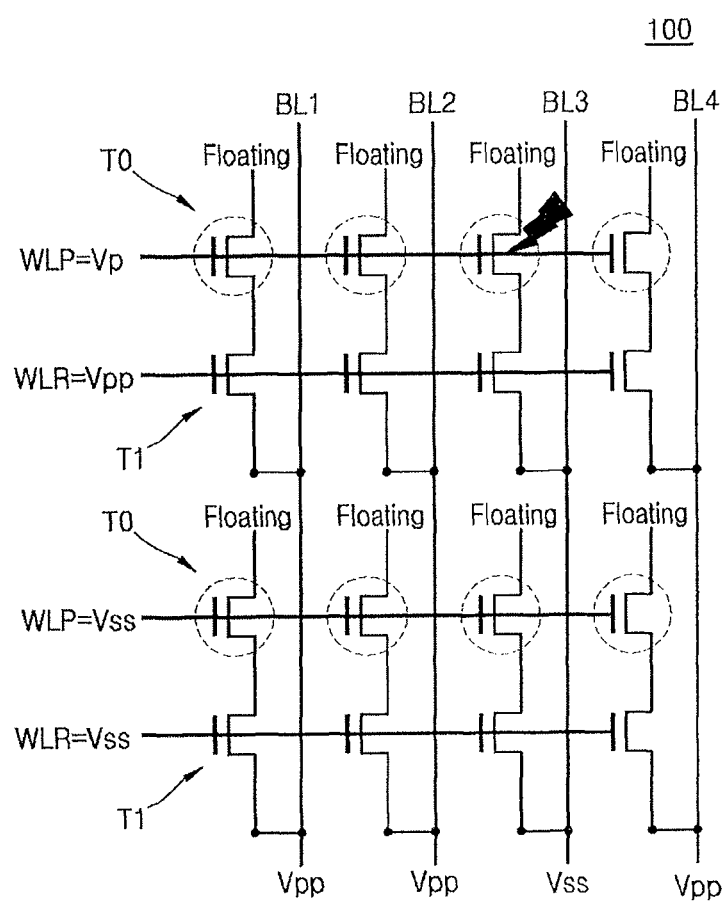
FIG. 13 illustrates an embodiment of an anti-fuse array.

FIG. 13 illustrates an embodiment of a circuit diagram for describing an anti-fuse array and an operation thereof according. As illustrated in FIG. 13, the anti-fuse device 100 may have a structure in which a plurality of unit cells are arranged in a 2D array pattern. Each of the unit cells includes one program transistor T0 and one read transistor T1. For convenience, FIG. 13 illustrates eight unit cells, but a different number of unit cells may be included in other embodiments. For example, the anti-fuse device 100 may include hundreds of thousands or millions of unit cells.

As illustrated in FIG. 13, four unit cells may be arranged in an upper portion of the anti-fuse array and four unit cells may be arranged in a lower portion of the anti-fuse array. Each of bit lines BL1, BL2, BL3, and BL4 may be commonly connected to a source area of the read transistor T1 of one unit cell of the upper portion and one unit cell of the lower portion.

By this connection structure, a program voltage Vp may be applied to a gate electrode of the program transistor T0 of the unit cells of the upper portion, a source voltage Vpp may be applied to a gate electrode of the read transistor T1 of the unit cells of the upper portion, a ground voltage Vss may be applied to a gate electrode of the program transistor T0 of the unit cells of the lower portion, and a ground voltage Vss may be applied to a gate electrode of the read transistor T1 of the unit cells of the lower portion. Also, the ground voltage Vss may be applied to only the bit line BL3 that is the third from the left from among the four bit lines BL1, BL2, BL3, and BL4. The source voltage Vpp, and the applied to the other bit lines BL1, BL2, and BL4.

When the voltages are applied in this manner, for the unit cells of the lower portion, the ground voltage Vss is applied to the program transistor T0. Thus, insulation breakdown of a gate insulating layer may not occur. For the unit cells of the upper portion, the source voltage is applied to the read transistor T1. Thus, the read transistor T1 may be turned on, and the voltage of the bit line may be applied to a source/drain area of the program transistor T0 through the read transistor T1.

Also, since the program voltage Vp is applied to the gate electrode of the program transistor T0, insulation breakdown of a gate insulating layer of the program transistor T0 may occur depending on a difference between the program voltage Vp and the voltage applied to the bit line BL. Since the ground voltage Vss is applied to the third bit line BL3, insulation breakdown of the gate insulating layer may occur only in the program transistor T0 of the unit cell that is the third from the left (indicated by a lightning mark) from among the unit cells of the upper portion. Thus, the corresponding program transistor T0 may have an on-state with low resistance.

In one embodiment, the source voltage Vpp may be about 3V and the program voltage Vp may be equal to or higher than about 6V. In one embodiment, the source voltage Vpp and the program voltage Vp may be variably changed, for example, based on the characteristics of the program transistor T0 and/or the read transistor T1 in the unit cell of the anti-fuse device 100.

Figure 14:
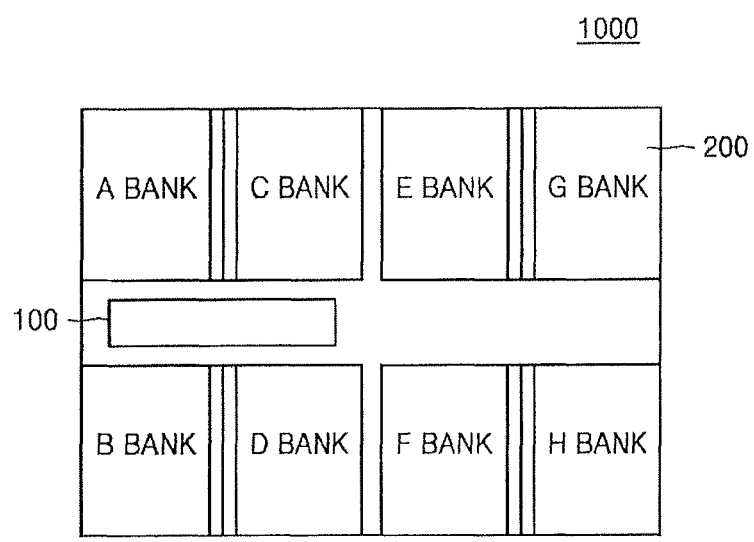
FIG. 14 illustrates an embodiment of a memory device.

FIG. 14 illustrates an embodiment of a memory device 1000 including an anti-fuse device according to any of the aforementioned embodiments. Referring to FIG. 14, the memory device 1000 may include a plurality of banks 200 and the anti-fuse device 100.

Eight banks 200 are illustrated, but a different number of banks may be included in another embodiment. When there are eight banks 200 and each has a capacity of 128 megabyte (MB), the capacity of the memory device 1000 may be 1 gigabyte (GB). Each bank 200 may include a plurality of memory cells, including normal memory cells and spare or redundancy memory cells. The spare memory cells may be preliminary memory cells to be substituted for normal memory cells when errors occur in the normal memory cells.

The anti-fuse device 100 may be, for example, the anti-fuse device 100 of FIG. 1B. In one embodiment, the memory device 1000 may include the anti-fuse devices 100a through 100l of FIGS. 3A to 12, in addition to the anti-fuse device 100 of FIG. 1B. The anti-fuse device 100 may include a plurality of unit cells in a 2D array structure, where the unit cells correspond to the normal memory cells. When errors occur in the normal memory cells, the anti-fuse device 100 may replace the normal memory cells which have errors with the spare memory cells.

The memory device 1000 may be, for example, a dynamic random access memory (DRAM) device, a flash memory device, a magnetic random access memory (RAM) (MRAM) device, a ferroelectric RAM (FeRAM) device, a resistive RAM (ReRAM) device, or a phase-change RAM (PRAM) device. Also, the memory device 1000 according to the present embodiment may be realized as a single chip package or a multi-chip package. Also, the memory device 1000 may be realized as a package on package (PoP), a ball grid array (BGA) package, a chip scale package (CSP), a plastic leaded chip carrier (PLCC) package, a plastic dual in-line package (PDIP), a chip on board (COB) package, a ceramic dual in-line package (CERDIP), a metric quad flat package (MQFP), a thin quad flat package (TQFP), a small outline IC (SOIC) package, a shrink small outline package (SSOP), a thin small outline package (TSOP), a system in package (SIP), a multi chip package (MCP), a wafer level package (WLP), or a wafer-level processed (WSP) stack package.

Figure 15:
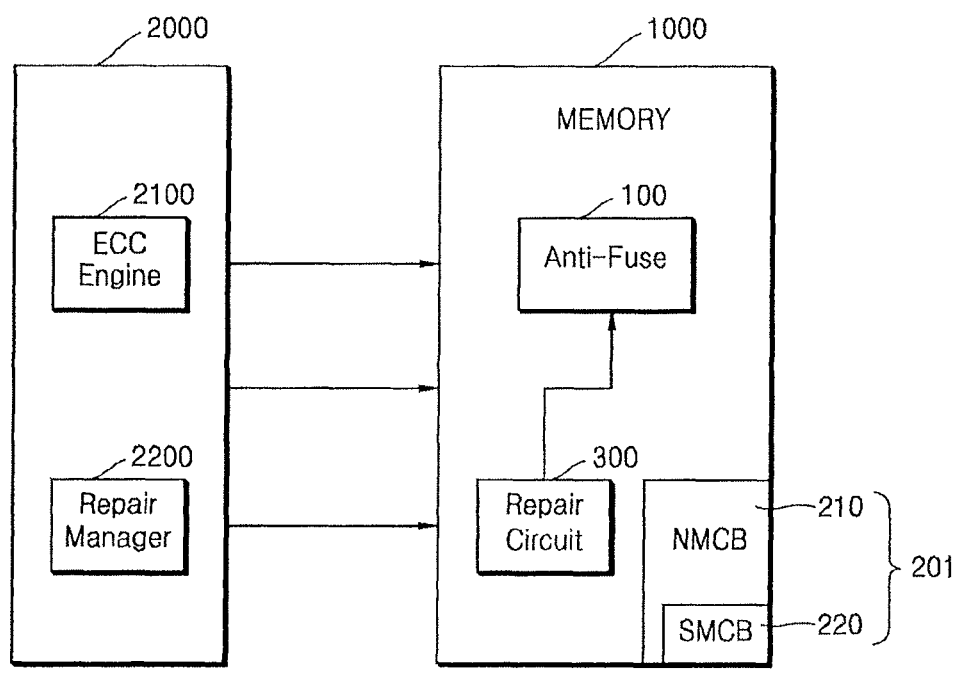
FIG. 15 illustrates an embodiment of a memory device and a memory controller.

FIG. 15 illustrates an embodiment of the memory device 1000 connected to a memory controller 2000. Referring to FIG. 15, the memory device 1000 may include the anti-fuse device 100, a memory cell block 201, and a repair circuit 300. The memory device 1000 may be, for example, a DRAM device or another type of memory device. The anti-fuse device 100 may be the anti-fuse device 100 of FIG. 1B. In one embodiment, the memory device 1000 may include the anti-fuse devices 100a to 100l of FIGS. 3A to 12 in addition to the anti-fuse device 100 of FIG. 1B.

The memory cell block 201 may include a normal memory cell block (NMCB) 210 and a spare memory cell block (SMCB) 220. The normal memory cell block 210 may form a bank.

The repair circuit 300 may apply a blowing current or a program voltage to a corresponding unit cell in the anti-fuse device 100 based on an address applied thereto during a repair operation. Also, redundancy information may be stored in the anti-fuse device 100 based on the repair operation. Accordingly, error memory cells in the normal memory cell block 210 of the memory cell block 201 may be replaced by spare memory cells in the spare memory cell block 220 via the anti-fuse device 100. For example, during a memory access operation, when an address for accessing the error memory cells is applied to the memory cell block 201, the spare memory cells may be accessed, rather than the error memory cells, based on the redundancy information stored in the anti-fuse device 100. The repair operation may be performed in a row unit or a column unit.

The repair operation with respect to the memory device 1000 is performed under control of the memory controller 2000. The memory controller 2000 may include an error-check correction (ECC) engine 2100 and a repair manager 2200. The ECC engine 2100 may perform an ECC operation on read data or write data to correct bit errors. The repair manager 2200 may activate a system management interrupt (SMI) generation control signal based on a result of the error correction of the ECC engine 2100. When the SMI generation control signal is activated, an SMI generator may generate SMI. The SMI may be provided to a processor via a bus interface connected to a system bus.

Figure 16:
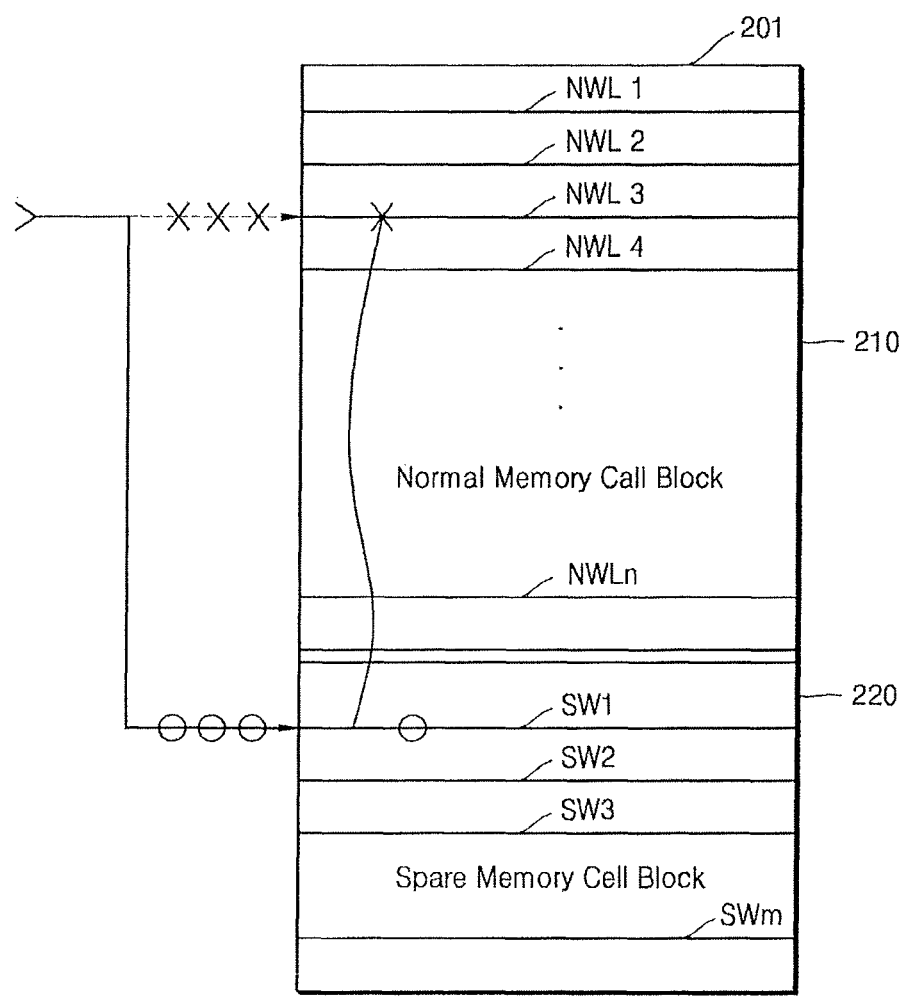
FIG. 16 illustrates an embodiment of a repairing process for the memory device.

FIG. 16 illustrates an example of a repair operation in a row unit in the memory device 1000 of FIG. 15. Referring to FIG. 16, the memory cell block 201 may include the normal memory cell block 210 and the spare memory cell block 220. The normal memory cell block 210 may be part of a memory bank, and a plurality of memory banks may be included in the memory cell block 201.

The normal memory cell block 210 may include a plurality of normal memory cells connected to a plurality of normal word lines NWL1 through NWLn, respectively. For example, one normal memory cell may be a DRAM cell including one access transistor and one storage capacitor.

The spare memory cell block 220 may include a plurality of spare memory cells connected to a plurality of spare word lines SWL1 through SWLm, respectively. One spare memory cell may be a DRAM cell as the normal memory cell.

FIG. 16 illustrates an example where the third normal word line NWL3 is replaced in a row unit when at least one of the normal memory cells, which are connected to the third normal word line NWL3 of the normal word lines NWL1 to NWLn, is determined to have an error. For example, the third normal word line NWL3 may be replaced by a first spare word line SWL1 via the repair operation.

During a memory access operation, when a row address for accessing a row of error memory cells is applied to the memory cell block 201, the first spare word line SWL1 (instead of the third normal word line NWL3) may be enabled based on the redundancy information stored in the anti-fuse device (e.g., 100 of FIG. 15).

The repair operation in the row unit is described with reference to FIG. 16. However, a repair operation performing replacement in a column unit based on a column address may also be performed.

Figure 17A:
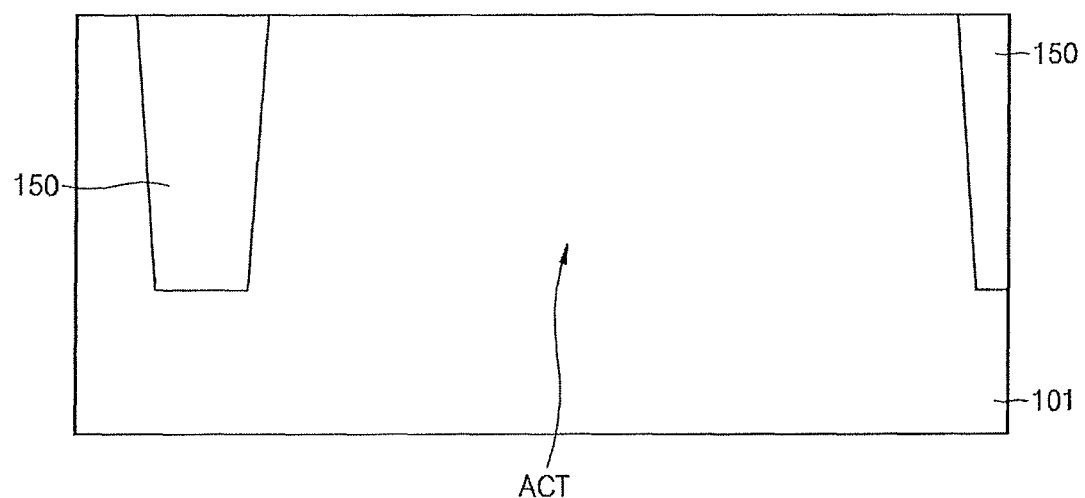
FIGS. 17A to 17I illustrate stages of a method for manufacturing an anti-fuse device according to an embodiment.

FIGS. 17A to 17I illustrates various stages of an embodiment of a method for manufacturing the anti-fuse device 100 of FIG. 1B. Referring to FIG. 17A, first, the STI 150 defining the active area ACT is formed on the semiconductor substrate 101. The semiconductor substrate 101 may include a silicon substrate, a Ge substrate, a SiGe substrate, a SOI substrate, or another type of substrate. The STI 150 may be formed by forming a trench in the semiconductor substrate 101 to have a predetermined depth and filling the trench with an insulating layer. The STI 150 may include, for example, at least one of a silicon oxide layer, a silicon nitride layer, a silicon oxynitride layer, or a combination thereof.

Figure 17B:
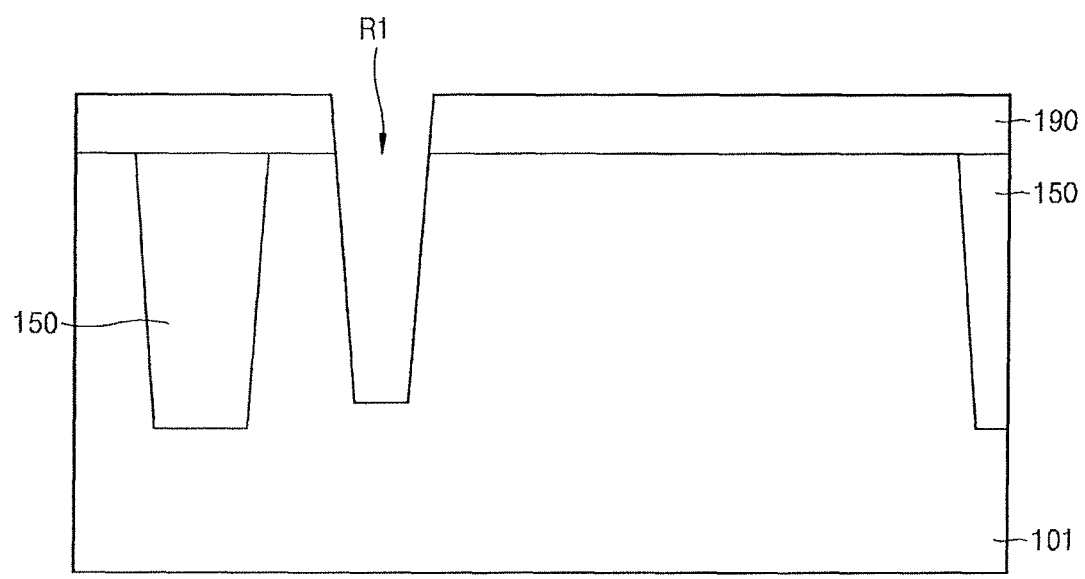

Referring to FIG. 17B, after the STI 150 is formed, a mask pattern 190 for defining a portion for forming a recess R1 is formed on the semiconductor substrate 101. The upper surface of the semiconductor substrate 101, on which the recess R1 is to be formed, may be exposed through an open portion of the mask pattern 190. The mask pattern 190 may include a nitride layer such as a silicon nitride layer, or an oxynitride layer such as a silicon oxynitride layer. For example, the mask pattern 190 may be formed by forming a corresponding material layer on the semiconductor substrate 101 using, for example, a chemical vapor deposition (CVD), a plasma-enhanced chemical vapor deposition (PECVD), an atomic layer deposition (ALD), an low-pressure CVD (LPCVD) or a sputtering process, and then performing patterning using a photolithography process.

After the mask pattern 190 is formed, the recess R1 is formed on the semiconductor substrate 101 by performing an etching process using the mask pattern 190 as an etch mask. According to an embodiment, the recess R1 may be formed by performing anisotropic etching on the portion of the semiconductor substrate 101, which is exposed via mask pattern 190. A side wall of the recess R1 may have a slight inclination toward the upper surface of the semiconductor substrate 101. In one embodiment, the etching process may be precisely controlled so that the side wall of the recess R1 is almost vertical with respect to the upper surface of the semiconductor substrate 101.

According to another embodiment, the recess R1 may be formed by sequentially performing anisotropic etching and isotropic etching so that the recess R1 has a bottom portion having an expanded profile. Through the isotropic etching, a bottom portion of the recess R1 formed by the anisotropic etching may be expanded to have a predetermined shape, e.g., a circular or oval shape. Thus, the recess R1 having the expanded bottom portion may have a structure combining an upper recess having an inclined profile with a lower recess having a rounded profile.

Figure 17C:
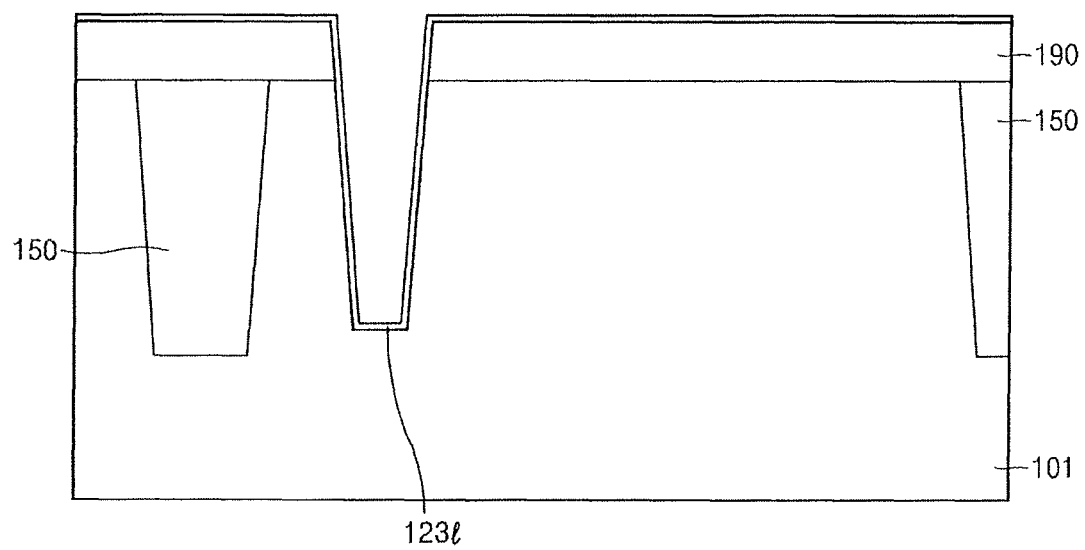

Referring to FIG. 17C, an insulating layer 123l is formed in the recess R1 and on an upper surface of the mask pattern 190. The insulating layer 123l may be conformally formed in the recess R1 and on the upper surface of the mask pattern 190. The insulating layer 123l may include, for example, a silicon oxide layer, a silicon nitride layer, or a silicon oxynitride layer. Also, the insulating layer 123l may include a high-k material layer. For example, the insulating layer 123l may include the high-k material layer, for example, described with reference to FIG. 8.

Figure 17D:
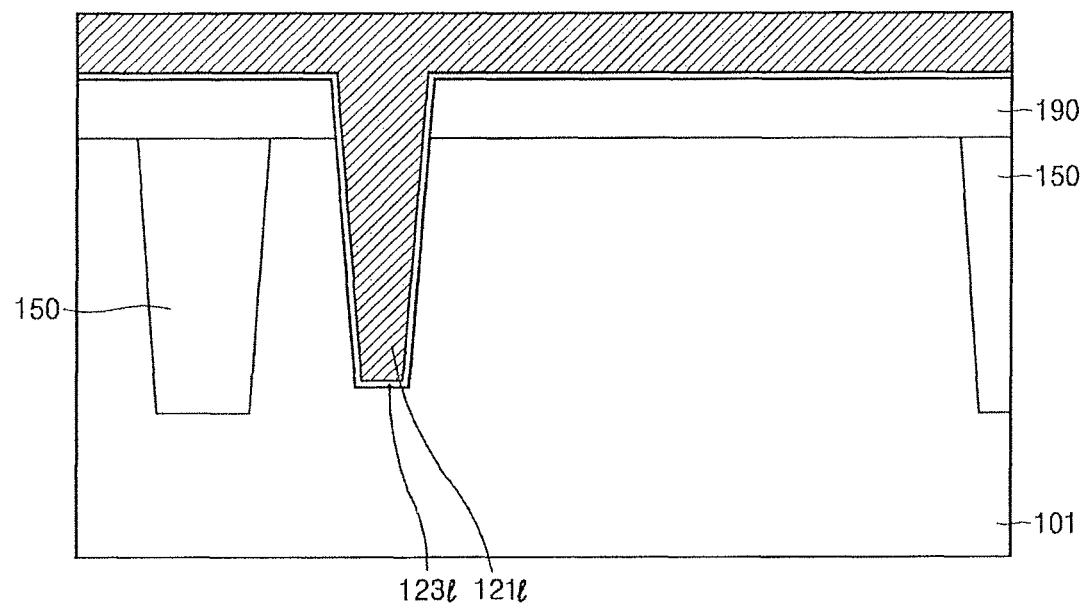

Referring to FIG. 17D, after the insulating layer 123l is formed, a conductive layer 121l covering the semiconductor substrate 101 is formed on the insulating layer 123l so that the recess R1 may be sufficiently buried by the conductive layer 121l. The conductive layer 121l may include a metal, poly silicon, or conductive metal nitride. When the conductive layer 121l includes poly silicon, first, a poly silicon layer may be formed on the insulating layer 123l and, then, an impurity ion may be diffused or injected on the polysilicon layer, or while the poly silicon layer is formed, an in-situ doping process may be performed to dope the poly silicon layer with impurity ions. The conductive layer 121l may be formed as multiple layers including poly silicon and metal, or multiple layers including only metal layers.

Figure 17E:
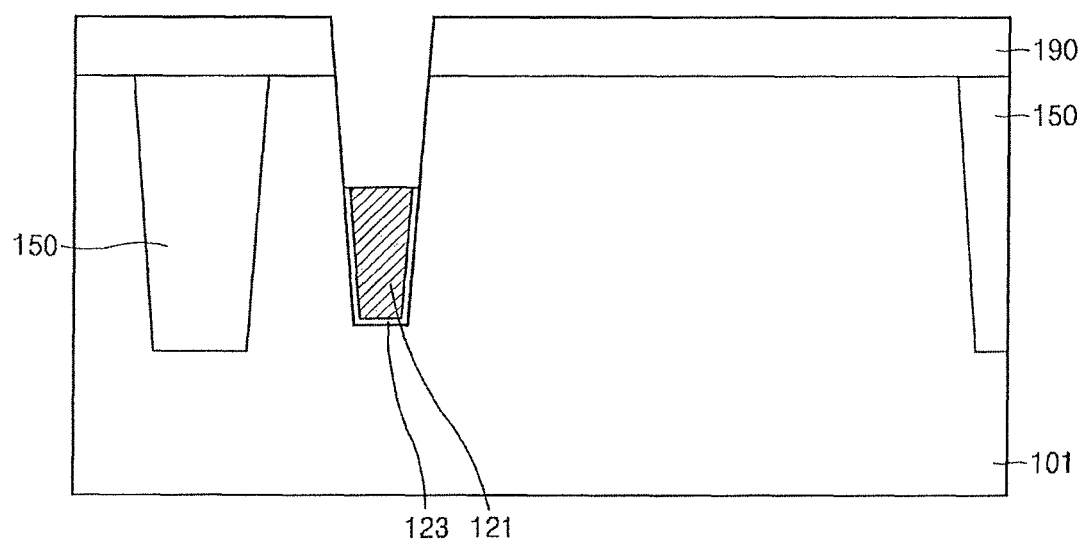

Referring to FIG. 17E, after the conductive layer 121l is formed, a portion of the conductive layer 121l may be removed by etching, so that the conductive layer 121l remains only at a lower portion of the recess R1, in order to form the gate electrode 121. Accordingly, the gate electrode 121 may have a recessed shape. As illustrated in FIG. 17E, the upper surface of the gate electrode 121 may be lower than the upper surface of the semiconductor substrate 101. The etching of the conductive layer 121l may be performed, for example, by an etch-back process.

Next, the exposed insulating layer 123l may be etched and removed to form the gate insulating layer 123. In one embodiment, the insulating layer 123*l* may not be etched and may be maintained. When the insulating layer 123*l* is maintained, the gate insulating layer 123 may be formed to have a structure that is the same as the structure of the gate insulating layer 123*a* of the gate structure 120*c* of FIG. 4.

Figure 17F:
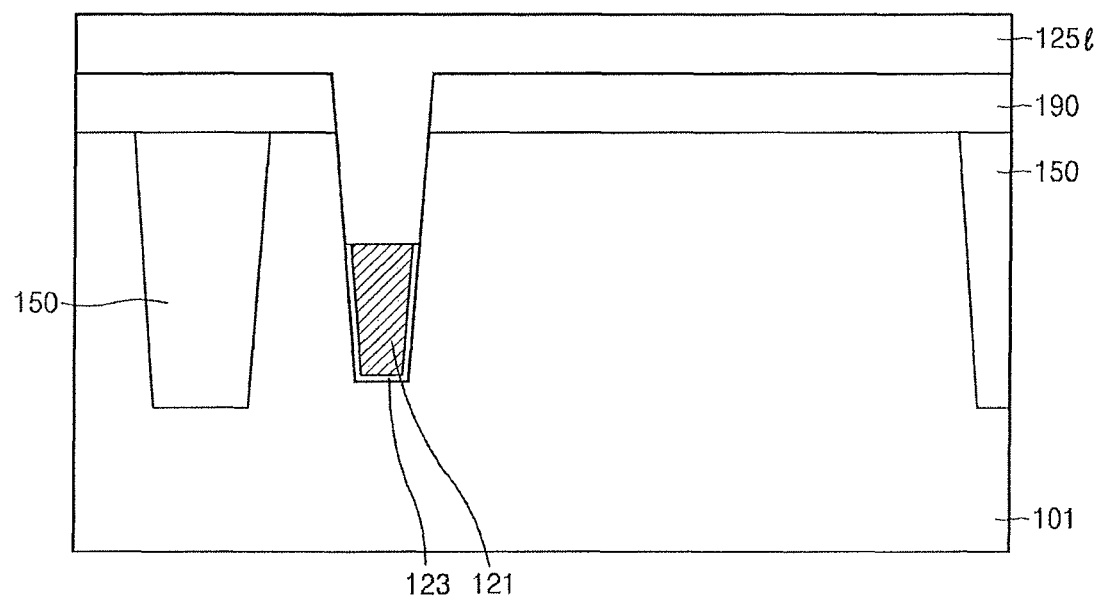

Referring to FIG. 17F, after the gate electrode 121 is formed, a capping material layer 125*l* may be formed on the gate electrode 121 and the mask pattern 190 to fill the remaining recess. The capping material layer 125*l* may include an oxide layer, a nitride layer, or an oxynitride layer. For example, the capping material layer 125*l* may include a silicon nitride layer.

Figure 17G:
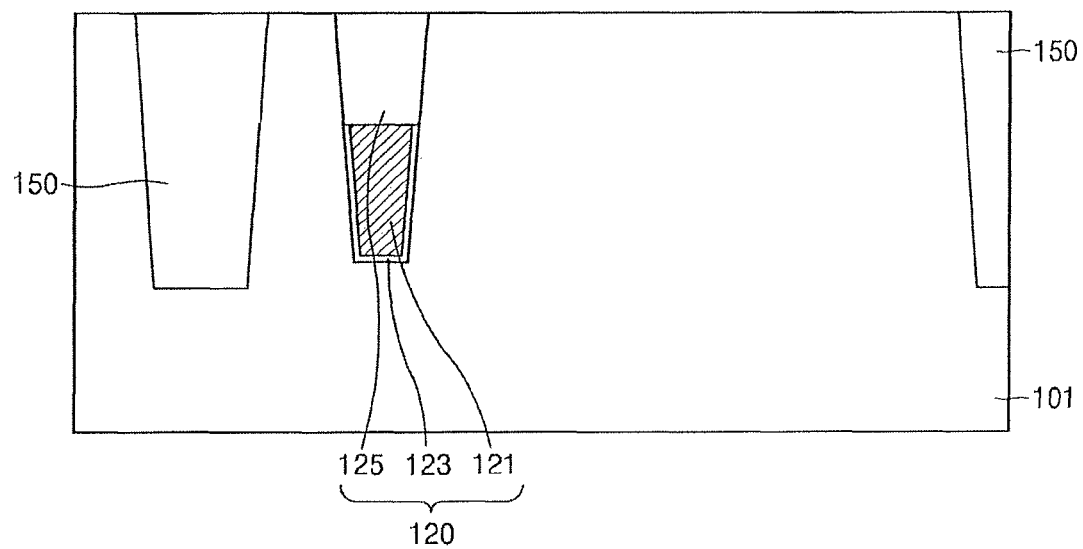

Referring to FIG. 17G, after the capping material layer 125*l* is formed, the capping material layer 125*l* and the mask pattern 190 are etched to expose the upper surface of the semiconductor substrate 101 and the upper surface of the STI 150. The method of etching may be, for example, CMP. If the insulating layer 123*l* is not etched and is maintained when the gate electrode 121 is formed in FIG. 17E, the insulating layer 123*l* may be etched together in the CMP process.

Thus, after the etching process, the capping layer 125 may be formed, and the gate structure 120 including the gate electrode 121, the gate insulating layer 123, and the capping layer 125 may be completely formed. The gate structure 120 may be, for example, the gate structure 120 of the program transistor T0 in the anti-fuse device 100 of FIG. 1B. Since the capping layer 125 is formed by a CMP process, upper surfaces of the semiconductor substrate 101, the STI 150, and the capping layer 125 may be on the same plane.

Figure 17H:
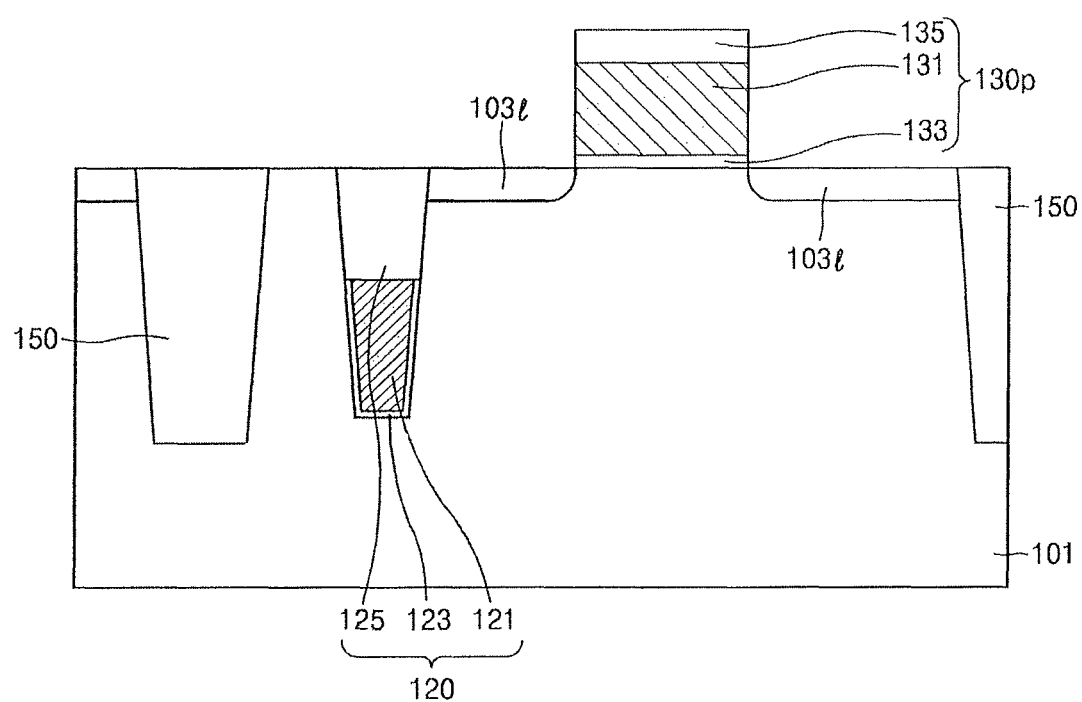

Referring to FIG. 17H, after the gate structure 120 is completely formed, a material layer pattern 130*p* for the gate structure 130 of the read transistor T1 is formed on the upper surface of the semiconductor substrate 101. The material layer pattern 130P may include, for example, the gate electrode 131, the gate insulating layer 133, and the capping layer 135. The material layer pattern 130*p* may be formed, for example, by sequentially forming corresponding material layers on the semiconductor substrate 101 and patterning the material layers by using a photolithography process. The gate insulating layer 133 and the gate electrode 131 may be formed using the materials described with reference to FIGS. 1B, 8, and 9. For example, the gate insulating layer 133 may be formed using an oxide layer or a nitride layer, such as silicon oxide layer or a silicon nitride layer, or may include a high-k material layer. Also, the gate electrode 131 may include poly silicon or a metal.

After the material layer pattern 130*p* is formed, impurity ions may be injected onto an upper portion of the semiconductor substrate 101 using the material layer pattern 130*p* as a mask to form an LDD area 103*l*. For reference, the LDD area 103*l* may be formed on the upper portion of the semiconductor substrate 101 between the STI 150 and the gate structure 120. In one embodiment, the exposed portion may be narrow or the upper portion of the semiconductor substrate 101 may not be exposed.

Figure 17I:
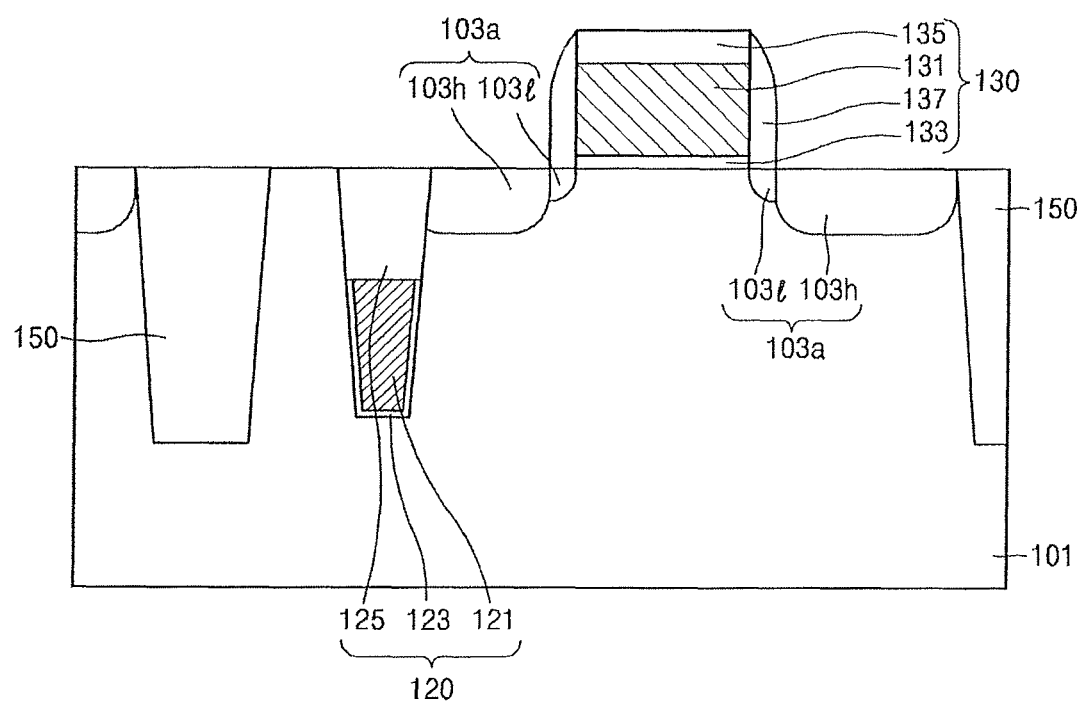

Referring to FIG. 17I, after the LDD area 103*l* is formed, the spacer 137 may be formed at different side surfaces of the material layer pattern 130*p* to completely form the gate structure 130 of the read transistor T1. After the gate structure 130 is completely formed, impurity ions may be injected onto the upper portion of the semiconductor substrate 101 in a high concentration, using the gate structure 130 as a mask, to form source/drain area 103*a*.

Next, impurity ions may be deeply injected in a source/drain area arranged between the program transistor T0 and the read transistor T1 to form the source/drain area 103*b*, as illustrated in FIG. 1B.

Figure 18A:
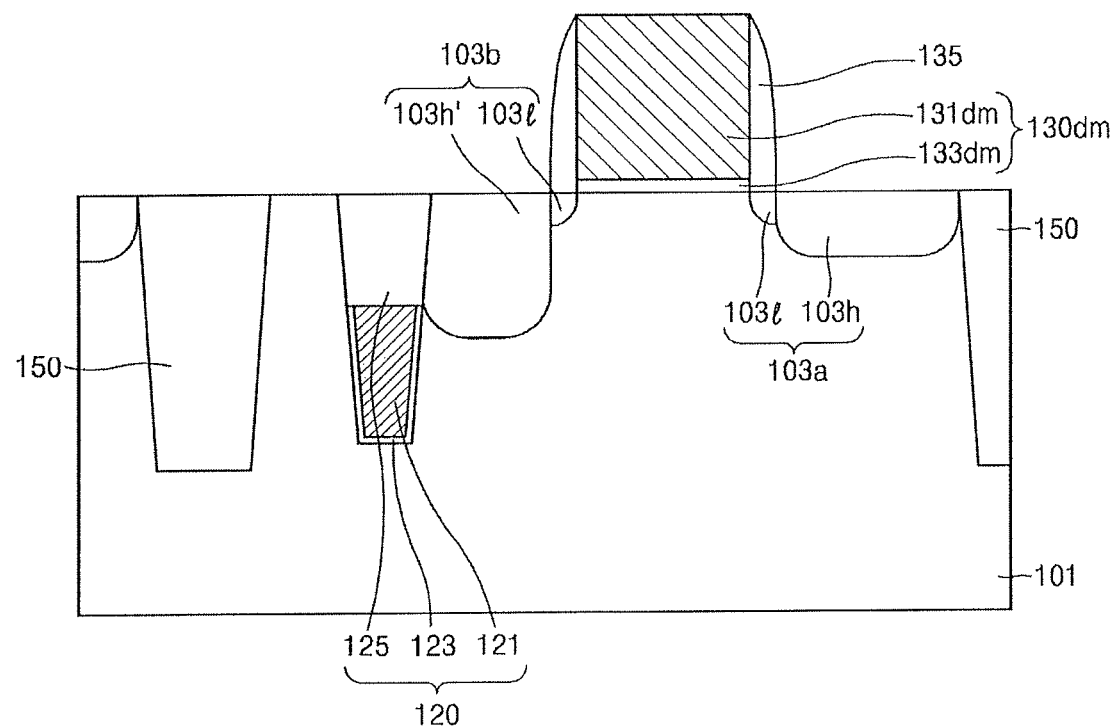
FIGS. 18A to 18D illustrate stages of a method for manufacturing an anti-fuse device according to another embodiment.

FIGS. 18A to 18D illustrate an embodiment of a method for manufacturing the anti-fuse device 100*k* of FIG. 10. Referring to FIG. 18A, first, the gate structure 120 of the program transistor T0 is formed using the process described with reference to FIGS. 17A to 17G. Then, a dummy gate structure 130*dm* is formed on an area on which the read transistor T1 is to be formed. The LDD area 103*l* is formed using the dummy gate structure 130*dm*. The dummy gate structure 130*dm* may include, for example, a dummy gate electrode 131*dm*, and a dummy gate insulating layer 133*dm*. The dummy gate electrode 131*dm* may include, for example, poly silicon. The dummy gate insulating layer 133*dm* may include an oxide layer or a nitride layer. The dummy gate electrode 131*dm* and the dummy gate insulating layer 133*dm* may be made from different materials in other embodiments.

After the LDD area 103*l* is formed, the spacer 137 is formed, and the source/drain areas 103*a* and 103*b* are formed using the dummy gate structure 130*dm* and the spacer 137. The spacer 137 may include a nitride layer or an oxynitride layer such as a silicon nitride layer or a silicon oxynitride layer. Methods for forming the source/drain areas 103*a* and 103*b* may be the same as described in FIG. 17I.

Figure 18B:
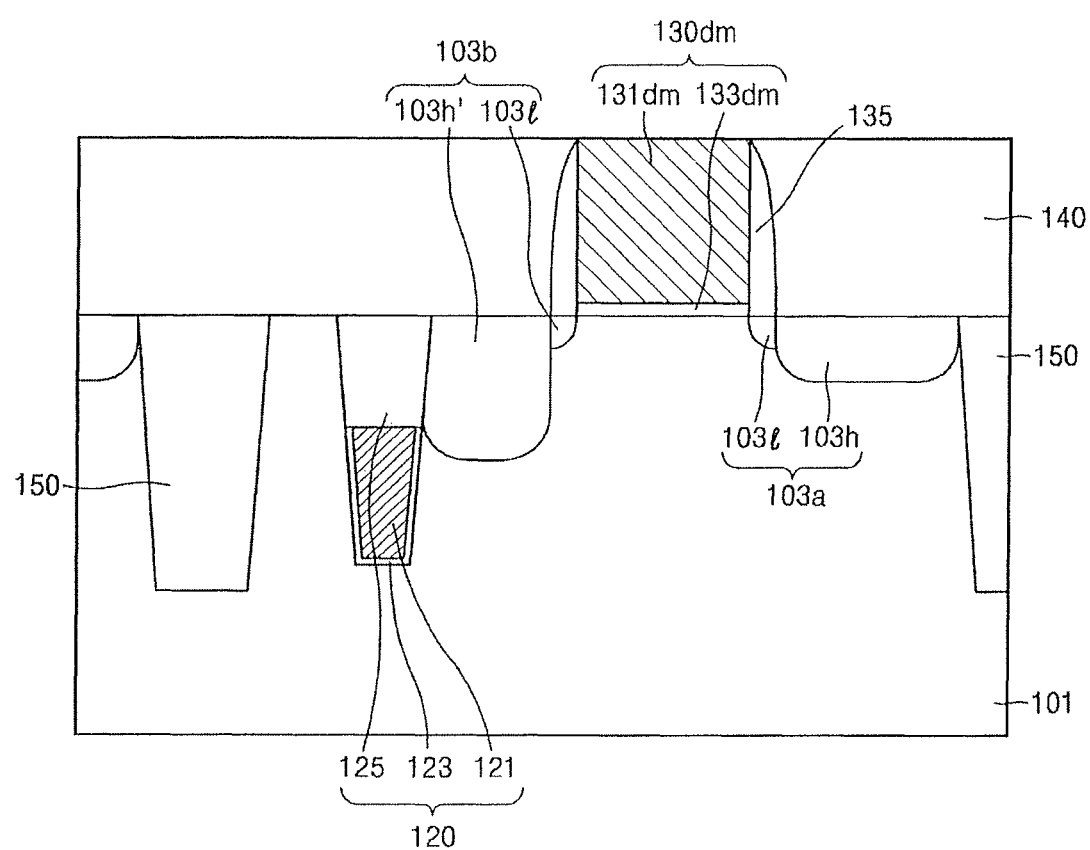

Referring to FIG. 18B, after the source/drain areas 103*a* and 103*b* are formed, an insulating layer covering the dummy gate structure 130*dm* and the spacer 137 is formed. An interlayer insulating layer 140 is formed by planarizing the insulating layer by etching. The planarization of the insulating layer may be performed, for example, using CMP. An upper surface of the dummy gate structure 130*dm* may be exposed via the planarization of the insulating layer. The interlayer insulating layer 140 may include at least one of a silicon oxide layer, a silicon nitride layer, a silicon oxynitride layer, or a combination thereof, and may be formed using a material having a different etch selectivity from the spacer 137.

Figure 18C:
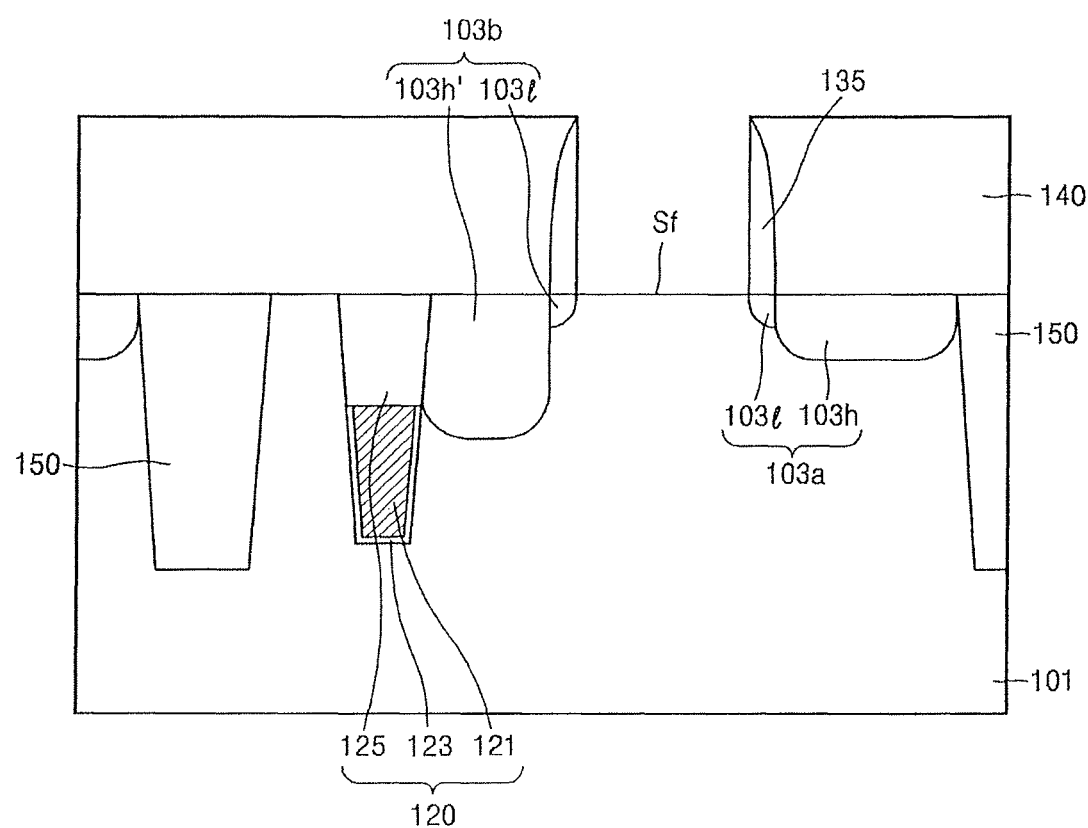

Referring to FIG. 18C, after the interlayer insulating layer 140 is formed, the dummy gate structure 130*dm* is removed. Through removal of the dummy gate structure 130*dm*, the upper surface Sf of the semiconductor substrate 101 may be exposed through the spacer 137. The spacer 137 and the interlayer insulating layer 140 may have an etch selectivity with respect to the dummy gate structure 130*dm*. Accordingly, the dummy gate structure 130*dm* may be easily removed, for example, through wet etching. Also, removal of the dummy gate structure 130*dm* may be sequentially performed such that the dummy gate electrode 131*dm* is removed first and then the dummy gate insulating layer 133*dm* is removed.

Figure 18D:
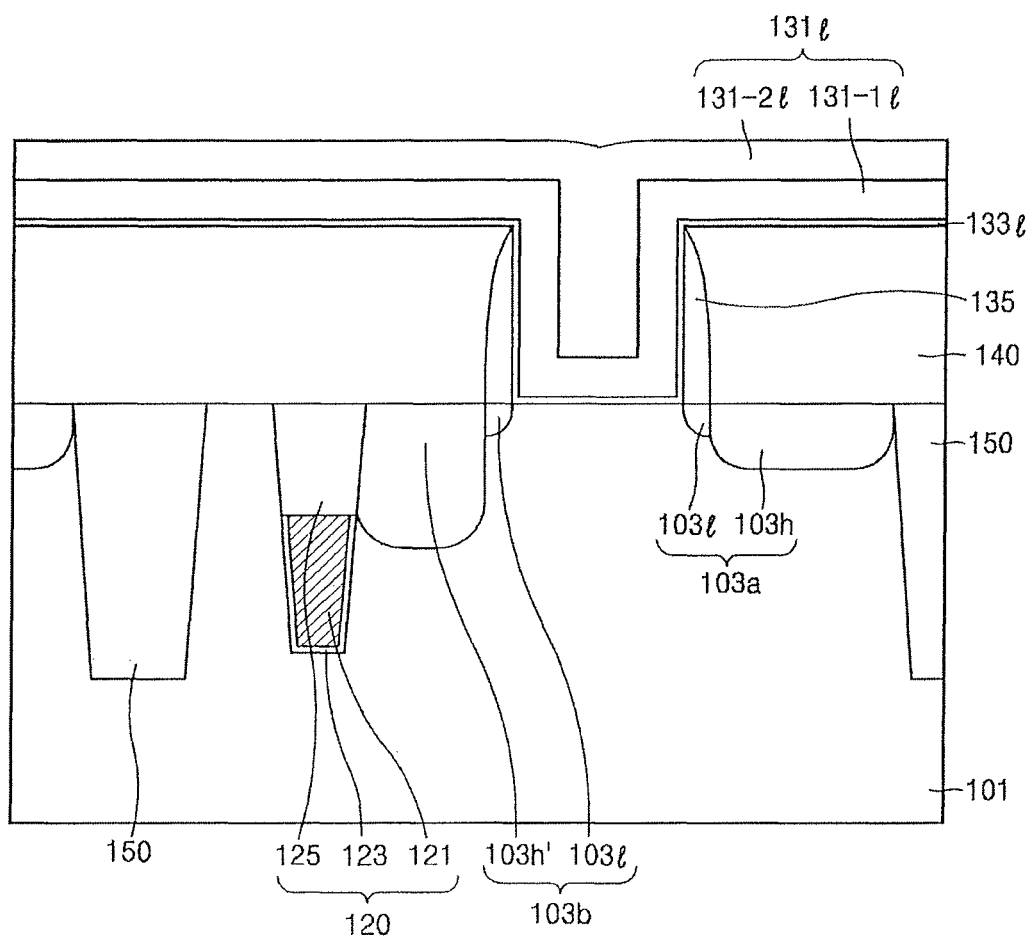

Referring to FIG. 18D, after the dummy gate structure 130*dm* is removed, an insulating layer 133*l*, a lower metal layer 131-1*l*, and an upper metal layer 131-2*l* are sequentially formed on a resultant semiconductor substrate 101 conformally. Examples of materials of the insulating layer 133*l*, the lower metal layer 131-1*l*, and the upper metal layer 131-2*l* are as described with reference to FIG. 10. Then, the insulating layer 133*l*, the lower metal layer 131-1*l*, and the upper metal layer 131-2*l* are removed by etching to expose an upper surface of the interlayer insulating layer 140. The insulating layer 133*l*, the lower metal layer 131-1*l*, and the upper metal layer 131-2*l* may be etched, for example, by CMP. By removing the insulating layer 133*l*, the lower metal layer 131-1*l*, and the upper metal layer 131-2*l* by the CMP, the read transistor T1 of the anti-fuse device 100*k* of FIG. 10 may be completely formed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. An anti-fuse device, comprising:
   a program transistor to execute a program via insulation breakdown of a gate insulating layer, the program transistor having a buried transistor structure in which at least a portion of a first gate electrode on the gate insulating layer is buried in a substrate; and
   a read transistor, adjacent to the program transistor, to read a state of the program transistor, the read transistor having a planar transistor structure in which a second gate electrode of the read transistor is on an upper surface of the substrate.

2. The anti-fuse device as claimed in claim 1, wherein at least a portion of the gate insulating layer is buried in the substrate.

3. The anti-fuse device as claimed in claim 1, wherein the program transistor has a buried cell array transistor (BCAT) structure in which the first gate electrode is completely buried in the substrate.

4. The anti-fuse device as claimed in claim 1, wherein:
   the program transistor includes a first gate structure including the first gate electrode and a capping insulating layer on the first gate electrode, and a first impurity region arranged in an upper portion of the substrate in a direction in which the read transistor is arranged, and
   the read transistor includes a second gate structure including the second gate electrode, the first impurity region shared with the program transistor, and a second impurity region arranged in a direction opposite to a direction in which the first impurity region is arranged.

5. The anti-fuse device as claimed in claim 4, wherein a shallow trench isolation (STI) is in the substrate and contacts or overlaps the first gate structure in a direction opposite to a direction in which the read transistor is arranged.

6. The anti-fuse device as claimed in claim 4, wherein:
   the first gate structure extends in a first direction, and
   a width of the first gate structure is less than a width of the second gate structure in a second direction crossing the first direction.

7. The anti-fuse device as claimed in claim 4, wherein the first impurity region is deeper than the second impurity region.

8. The anti-fuse device as claimed in claim 4, wherein a lower surface of the first impurity region is lower than an upper surface of the first gate electrode.

9. The anti-fuse device as claimed in claim 1, wherein:
   the second gate electrode includes a metal material, and
   a gate insulating layer between the second gate electrode and the substrate includes a high-k material.

10. The anti-fuse device as claimed in claim 1, wherein:
    a plurality of unit cells are arranged in a two-dimensional (2D) array structure, and
    each of the plurality of unit cells includes one program transistor and one read transistor.

11. A semiconductor device comprising an anti-fuse device, comprising:
    a program transistor including a first gate structure and a first impurity region, wherein the first gate structure includes a buried gate electrode buried in a substrate with a gate insulating layer between the buried gate electrode and the substrate, the first impurity region is arranged in an upper portion of the substrate adjacent to the first gate structure, and the program transistor executes a program via insulation breakdown of the gate insulating layer; and
    a read transistor adjacent to the program transistor, the read transistor including a second gate structure, the first impurity region, and a second impurity region, wherein the second gate structure includes a planar gate electrode on an upper surface of the substrate with a gate insulating layer between the planar gate electrode and the substrate, the first impurity region is on a side surface of the second gate structure, the second impurity region is arranged in an upper portion of the substrate on another side surface of the second gate structure, and the read transistor reads a state of the program transistor.

12. The semiconductor device as claimed in claim 11, wherein:
    a shallow trench isolation (STI) is adjacent to the first gate structure in a direction opposite to a direction in which the read transistor is arranged, and
    the STI contacts a side surface of the first gate structure or overlaps a portion of the first gate structure.

13. The semiconductor device as claimed in claim 11, wherein:
    the first gate structure and the second gate structure extend in a first direction, and
    a width of the first gate structure is less than a width of the second gate structure in a second direction crossing the first direction.

14. The semiconductor device as claimed in claim 11, wherein the first impurity region has substantially a same depth as the second impurity region or a greater depth than the second impurity region.

15. The semiconductor device as claimed in claim 11, wherein:
    the first impurity region has a greater depth than the second impurity region, and
    a lower surface of the first impurity region is lower than an upper surface of the buried gate electrode.

16. The semiconductor device as claimed in claim 11, wherein:
    the gate insulating layer of the second gate structure includes a high-k material, and
    the planar gate electrode includes a metal material.

17. A memory device, comprising:
    an anti-fuse device including a plurality of anti-fuse unit cells arranged in a two-dimensional (2D) array structure;
    a repair circuit to apply a program voltage to corresponding anti-fuse unit cells in the anti-fuse device based on a received address in a repair operation; and
    a memory cell block including a normal memory cell block and a spare memory cell block, spare memory cells in the spare memory cell block, rather than error memory cells in the normal memory cell block, are to be accessed due to redundancy information stored in the anti-fuse device, wherein each of the plurality of anti-fuse unit cells includes:
- a program transistor to execute a program based on insulation breakdown of a gate insulating layer by the program voltage applied to the program transistor, the program transistor having a buried transistor structure in which at least a portion of a first gate electrode on the gate insulating layer is buried in a substrate, and
- a read transistor, adjacent to the program transistor, to read a state of the program transistor, the read transistor having a planar transistor structure in which a second gate electrode of the read transistor is on an upper surface of the substrate.

18. The memory device as claimed in claim 17, wherein:
the program transistor includes a first gate structure including the first gate electrode and a first impurity region arranged in an upper portion of the substrate in a direction in which the read transistor is arranged, the read transistor includes a second gate structure including the second gate electrode, the first impurity region shared by the program transistor, and a second impurity region arranged in a direction opposite to a direction in which the first impurity region is arranged, a shallow trench isolation (STI) is in the substrate adjacent to the first gate electrode in a direction opposite to a direction in which the read transistor is arranged, and the STI contacts a side surface of the first gate structure or overlaps a portion of the first gate structure.

19. The memory device as claimed in claim 18, wherein the first impurity region has substantially a same depth as the second impurity region or a greater depth than the second impurity region.

20. The memory device as claimed in claim 17, wherein the memory device is a dynamic random access memory (DRAM) device.

* * * * *